US011133253B2

(12) United States Patent
Lee et al.

(10) Patent No.: US 11,133,253 B2
(45) Date of Patent: Sep. 28, 2021

(54) SEMICONDUCTOR DEVICES INCLUDING A THICK METAL LAYER

(71) Applicant: Samsung Electronics Co., Ltd., Suwon-si (KR)

(72) Inventors: Juik Lee, Anyang-si (KR); Joongwon Shin, Suwon-si (KR); Jihoon Chang, Yongin-si (KR); Junghoon Han, Hwaseong-si (KR); Junwoo Lee, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/885,438

(22) Filed: May 28, 2020

(65) Prior Publication Data

US 2021/0104462 A1    Apr. 8, 2021

(30) Foreign Application Priority Data

Oct. 2, 2019    (KR) .......................... 10-2019-0122357

(51) Int. Cl.
| | | |
|---|---|---|
| *H01L 23/528* | (2006.01) | |
| *H01L 23/532* | (2006.01) | |
| *H01L 25/065* | (2006.01) | |
| *H01L 25/18* | (2006.01) | |
| *H01L 23/522* | (2006.01) | |

(Continued)

(52) U.S. Cl.
CPC ........ *H01L 23/5283* (2013.01); *H01L 23/481* (2013.01); *H01L 23/5226* (2013.01); *H01L 23/53214* (2013.01); *H01L 23/53228* (2013.01); *H01L 23/53257* (2013.01); *H01L 24/05* (2013.01); *H01L 24/13* (2013.01); *H01L 25/0657* (2013.01); *H01L 25/18* (2013.01); *H01L 27/10814* (2013.01);

(Continued)

(58) Field of Classification Search
CPC combination set(s) only.
See application file for complete search history.

(56) References Cited

U.S. PATENT DOCUMENTS 8,004,086 B2 *   8/2011   Tomita ................ H01L 23/5283
                                                                257/758
9,543,228 B2 *   1/2017   Kanda ................ H01L 23/3677
(Continued)

FOREIGN PATENT DOCUMENTS

| JP | 4422004 B2 | 12/2009 |
|---|---|---|
| JP | 2012039001 A | 2/2012 |
| KR | 101941173 B1 | 1/2019 |

*Primary Examiner* — Mamadou L Diallo
(74) *Attorney, Agent, or Firm* — Muir Patent Law, PLLC

(57) ABSTRACT

A semiconductor device includes a plurality of middle interconnections and a plurality of middle plugs, which are disposed in an interlayer insulating layer and on a substrate. An upper insulating layer is disposed on the interlayer insulating layer. A first upper plug, a first upper interconnection, a second upper plug, and a second upper interconnection are disposed in the upper insulating layer. Each of the plurality of middle interconnections has a first thickness. The first upper interconnection has a second thickness that is greater than the first thickness. The second upper interconnection has a third thickness that is greater than the first thickness. The third thickness is twice to 100 times the first thickness. The second upper interconnection includes a material different from the second upper plug.

19 Claims, 15 Drawing Sheets

(51) Int. Cl.
  *H01L 27/108* (2006.01)
  *H01L 23/00* (2006.01)
  *H01L 23/48* (2006.01)
(52) U.S. Cl.
  CPC ............ *H01L 2224/0401* (2013.01); *H01L 2224/05005* (2013.01); *H01L 2224/05124* (2013.01); *H01L 2224/05666* (2013.01); *H01L 2224/05681* (2013.01); *H01L 2224/05684* (2013.01); *H01L 2224/13006* (2013.01); *H01L 2225/06513* (2013.01); *H01L 2225/06544* (2013.01)

(56) References Cited

U.S. PATENT DOCUMENTS

| | | | |
|---|---|---|---|
| 9,850,130 | B2 | 12/2017 | Cho et al. |
| 9,893,278 | B1 | 2/2018 | Chuang et al. |
| 10,418,323 | B2 | 9/2019 | Matsubara et al. |
| 10,446,607 | B2 | 10/2019 | Yi et al. |
| 2004/0188843 | A1* | 9/2004 | Wakayama ........... H01L 23/564 257/758 |
| 2008/0001291 | A1* | 1/2008 | Nagai ..................... H01L 28/57 257/758 |
| 2010/0314620 | A1* | 12/2010 | Furusawa ............. H01L 21/768 257/48 |
| 2011/0266679 | A1* | 11/2011 | Hotta .................... H01L 23/585 257/758 |
| 2013/0256906 | A1* | 10/2013 | Mori ..................... H01L 23/562 257/774 |
| 2016/0218060 | A1 | 7/2016 | Matsubara et al. |
| 2017/0018515 | A1* | 1/2017 | Hamaguchi ....... H01J 37/32862 |
| 2018/0093892 | A1 | 4/2018 | Cho et al. |
| 2018/0182810 | A1 | 6/2018 | Yi et al. |
| 2018/0374795 | A1* | 12/2018 | Deguchi ............... H01L 21/768 |
| 2019/0198426 | A1* | 6/2019 | Choi ................. H01L 27/14636 |

* cited by examiner

SEMICONDUCTOR DEVICES INCLUDING A THICK METAL LAYER

CROSS-REFERENCE TO RELATED APPLICATION

This U.S. non-provisional patent application claims priority under 35 U.S.C. § 119 to and the benefit of Korean Patent Application No. 10-2019-0122357, filed on Oct. 2, 2019, in the Korean Intellectual Property Office (KIPO), the disclosure of which is incorporated herein by reference in its entirety.

BACKGROUND

1. Field

Devices and methods consistent with example embodiments relate to semiconductor devices having a thick metal layer and a method of forming the same.

2. Description of Related Art

A semiconductor device has various kinds of interconnections. When sectional areas of interconnections are reduced to increase integration density, problems, such as an increase in interconnection resistance and a reduction in signal transmission rate, are caused. Materials for interconnections and methods of forming the interconnections significantly affect the mass production efficiency and reliability of semiconductor devices.

SUMMARY

The example embodiments of the inventive concept are directed to providing a semiconductor device having improved current driving capability and a high signal transmission rate and a method of forming the semiconductor device.

According to example embodiments, the disclosure is directed to a semiconductor device comprising: an interlayer insulating layer disposed on a substrate; a plurality of middle interconnections disposed in the interlayer insulating layer; a plurality of middle plugs disposed in the interlayer insulating layer and between the plurality of middle interconnections; an upper insulating layer disposed on the interlayer insulating layer; a first upper plug disposed in the upper insulating layer and connected to one middle interconnection of the plurality of middle interconnections, the one middle interconnection having a first thickness; a first upper interconnection disposed in the upper insulating layer on the first upper plug and having a second thickness, wherein the second thickness is greater than the first thickness; a second upper plug disposed in the upper insulating layer on the first upper interconnection; a second upper interconnection disposed in the upper insulating layer on the second upper plug and having a third thickness, wherein the third thickness is greater than the first thickness; and an opening configured to pass through the upper insulating layer to expose the second upper interconnection, wherein the third thickness is in the range of 2 to 100 times the first thickness, and wherein the second upper interconnection comprises a material different from that of the second upper plug.

According to example embodiments, the disclosure is directed to a semiconductor device comprising: a plurality of semiconductor chips sequentially stacked on a printed circuit board (PCB), wherein at least one of the plurality of semiconductor chips comprises: a lower insulating layer disposed on a substrate; a memory cell disposed in the lower insulating layer; an interlayer insulating layer disposed on the lower insulating layer; a plurality of middle interconnections disposed in the interlayer insulating layer; a plurality of middle plugs disposed in the interlayer insulating layer and between the plurality of middle interconnections; an upper insulating layer disposed on the interlayer insulating layer; a first upper plug disposed in the upper insulating layer and connected to one middle interconnection of the plurality of middle interconnections, the one middle interconnection having a first thickness; a first upper interconnection disposed in the upper insulating layer on the first upper plug and having a second thickness, wherein the second thickness is greater than the first thickness; a second upper plug disposed in the upper insulating layer and on the first upper interconnection; a second upper interconnection disposed in the upper insulating layer on the second upper plug and having a third thickness, wherein the third thickness is greater than the first thickness; a bump disposed on the upper insulating layer, the bump extending into the upper insulating layer and contacting the second upper interconnection; and a through electrode extending into the substrate and connected to the plurality of middle interconnections, wherein the third thickness is in the range of 2 to 100 times the first thickness, and wherein the second upper interconnection comprises a material different from that of the second upper plug. According to example embodiments, the disclosure is directed to a semiconductor device comprising: a relay substrate; a microprocessor disposed on the relay substrate; a buffer chip disposed on the relay substrate; and a plurality of semiconductor chips sequentially stacked on the buffer chip, wherein at least one of the plurality of semiconductor chips comprises: a lower insulating layer disposed on a substrate; a memory cell disposed in the lower insulating layer; an interlayer insulating layer disposed on the lower insulating layer; a plurality of middle interconnections disposed in the interlayer insulating layer; a plurality of middle plugs disposed in the interlayer insulating layer and between the plurality of middle interconnections; an upper insulating layer disposed on the interlayer insulating layer; a first upper plug disposed in the upper insulating layer and connected to one middle interconnection of the plurality of middle interconnections, the one middle interconnection having a first thickness; a first upper interconnection disposed in the upper insulating layer on the first upper plug and having a second thickness, wherein the second thickness is greater than the first thickness; a second upper plug disposed in the upper insulating layer and on the first upper interconnection; a second upper interconnection disposed in the upper insulating layer on the second upper plug and having a third thickness, wherein the third thickness is greater than the first thickness; a bump disposed on the upper insulating layer, the bump extending into the upper insulating layer and contacting the second upper interconnection; and a through electrode extending into the substrate and connected to the plurality of middle interconnections, wherein the third thickness is in the range of 2 to 100 times the first thickness, and wherein the second upper interconnection comprises a material different from the second upper plug.

DETAILED DESCRIPTION OF EXEMPLARY EMBODIMENTS

Figure 1:
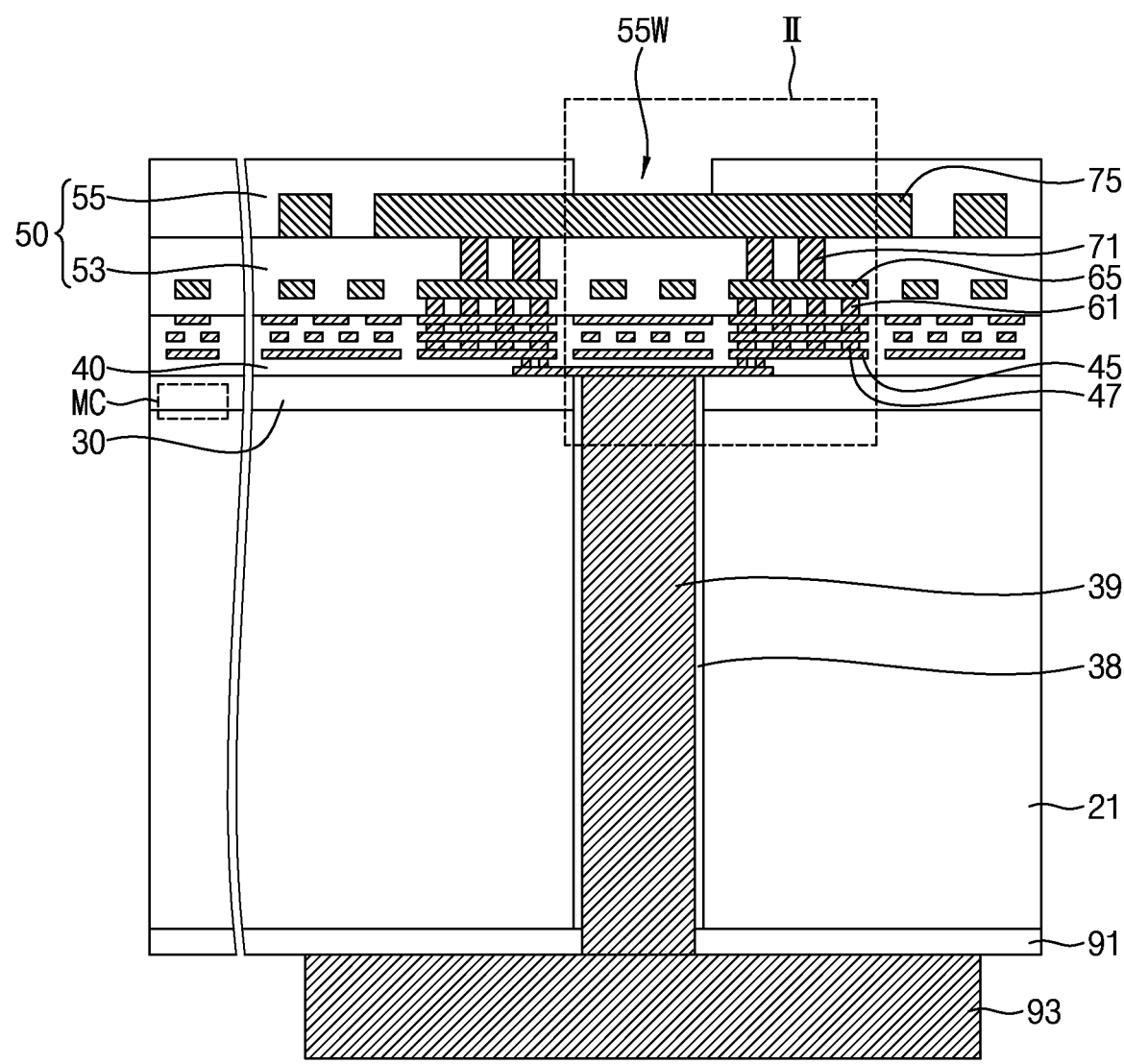
FIG. 1 is a cross-sectional view illustrating a semiconductor device according to an example embodiment of the inventive concept.

The present disclosure now will be described more fully hereinafter with reference to the accompanying drawings, in which various embodiments are shown. In the drawings, like numbers refer to like elements throughout.

Figure 2:
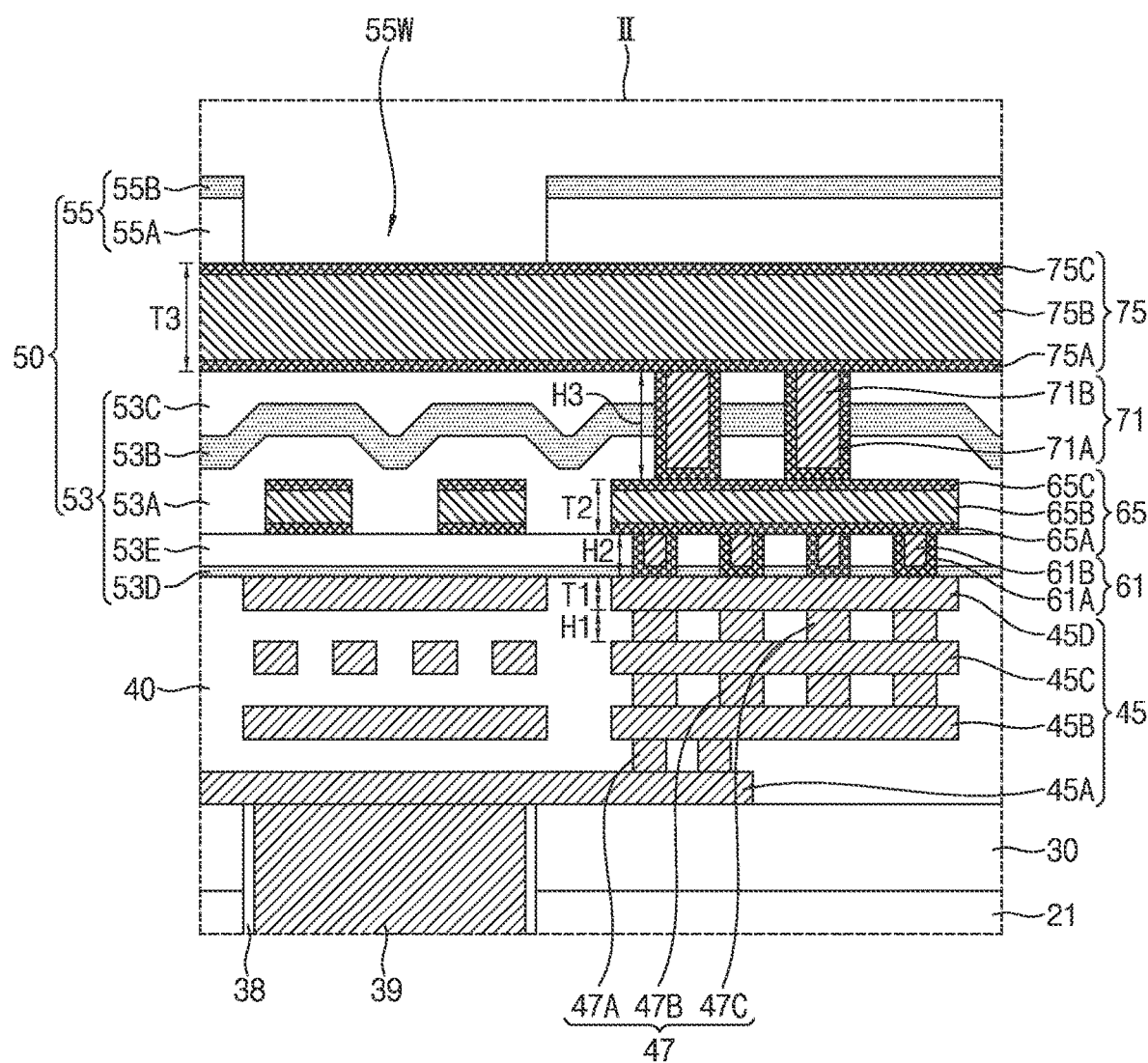
FIGS. 2 to 4 are enlarged views illustrating portions of FIG. 1.
Figure 3:
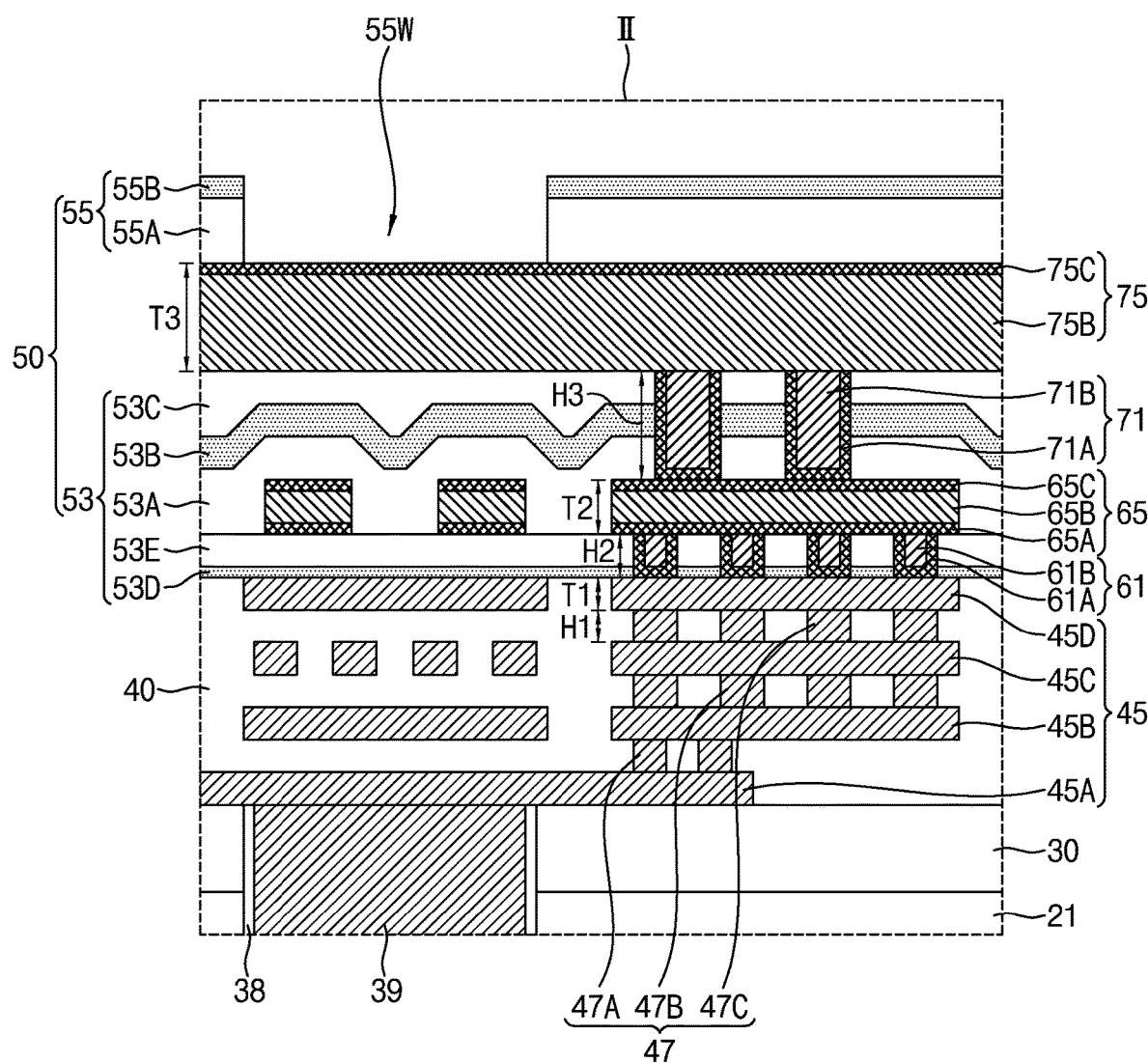
Figure 4:
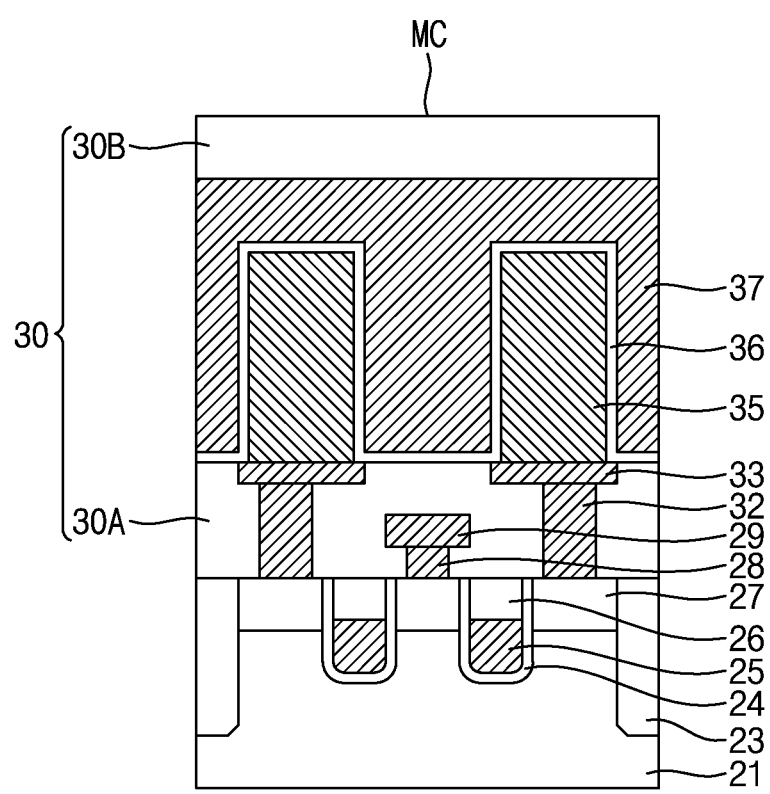

FIG. 1 is a cross-sectional view illustrating a semiconductor device according to an example embodiment of the inventive concept. FIGS. 2 and 3 are enlarged views illustrating portions II of FIG. 1, and FIG. 4 is an enlarged view illustrating portion MC of FIG. 1. A semiconductor device according to the embodiment of the inventive concept may include a thick top metal (TTM).

Referring to FIG. 1, the semiconductor device according to the embodiment of the inventive concept may include a substrate 21, a lower insulating layer 30, a memory cell MC, contact spacers 38, a through electrode 39, an interlayer insulating layer 40, a plurality of middle interconnections 45, a plurality of middle plugs 47, an upper insulating layer 50, a plurality of first upper plugs 61, a plurality of first upper interconnections 65, a plurality of second upper plugs 71, a plurality of second upper interconnections 75, an opening 55W, a substrate insulating layer 91, and a protruding electrode 93. The upper insulating layer 50 may include a first group 53 and a second group 55.

In an example embodiment, the plurality of second upper interconnections 75 may be a thick top metal (TTM). The memory cell MC may include a dynamic random access memory (DRAM) cell, a static RAM (SRAM) cell, a flash memory cell, a magneto-resistive RAM (MRAM) cell, a phase-change RAM (PRAM) cell, a ferroelectric RAM (FeRAM) cell, a resistive RAM (RRAM) cell, or a combination thereof. For example, the memory cell MC may include a DRAM cell.

The substrate 21 may include a semiconductor substrate such as a single crystalline silicon wafer. The lower insulating layer 30 may cover one surface of the substrate 21. For example, a lower surface of the lower insulating layer 30 may contact an upper surface of the substrate 21. The substrate insulating layer 91 may be disposed on another surface of the substrate 21. For example, an upper surface of the substrate insulating layer 91 may contact a lower surface of the substrate 21. The substrate 21 may be disposed between the lower insulating layer 30 and the substrate insulating layer 91. The memory cell MC may be disposed in the lower insulating layer 30. The memory cell MC may be electrically connected to at least a corresponding one of the plurality of middle interconnections 45.

The interlayer insulating layer 40 may be disposed on the lower insulating layer 30. The plurality of middle interconnections 45 and the plurality of middle plugs 47 may be disposed in the interlayer insulating layer 40. The plurality of middle plugs 47 may be disposed between the plurality of middle interconnections 45, electrically connecting the plurality of middle interconnections 45. The through electrode 39 may extend into the substrate 21, the lower insulating layer 30, and the substrate insulating layer 91. For example, an upper surface of the through electrode 39 may be coplanar with an upper surface of the lower insulating layer 30 and a lower surface of the through electrode 39 may be coplanar with a lower surface of the substrate insulating layer 91. The protruding electrode 93 may be disposed on the substrate insulating layer 91. For example, an upper surface of the protruding electrode 93 may contact the lower surface of the substrate insulating layer 91. The through electrode 39 may pass through the substrate 21, the lower insulating layer 30, and the substrate insulating layer 91 and be in contact with a selected one of the plurality of middle interconnections 45 and the protruding electrode 93. The through electrode 39 may be electrically connected to the plurality of middle interconnections 45. The contact spacers 38 may be disposed between the through electrode 39 and the substrate 21. Upper surfaces of the contact spacers 38 may be coplanar with an upper surface of the lower insulating layer 30, and lower surfaces of the contact spacers 38 may be coplanar with a lower surface of the substrate 21. A diameter of the through electrode 39 may range from about 1 µm to about 20 µm.

Each of the through electrode 39, the plurality of middle interconnections 45, the plurality of middle plugs 47, and the protruding electrode 93 may include a metal, a metal nitride, a metal oxide, a metal silicide, a conductive carbon, or a combination thereof. Each of the through electrode 39, the plurality of middle interconnections 45, the plurality of middle plugs 47, and the protruding electrode 93 may include copper (Cu), tungsten (W), aluminum (Al), nickel (Ni), tin (Sn), titanium (Ti), titanium nitride (TiN), tantalum (Ta), tantalum nitride (TaN), tungsten nitride (WN), or a combination thereof. For example, each of the through electrode 39, the plurality of middle interconnections 45, and the plurality of middle plugs 47 may include a Cu layer.

The first group 53 of the upper insulating layer 50 may be disposed on the interlayer insulating layer 40. The plurality of first upper plugs 61, the plurality of first upper interconnections 65, and the plurality of second upper plugs 71 may be disposed in the first group 53. The plurality of first upper plugs 61 may be in contact with a corresponding one of the plurality of middle interconnections 45. The plurality of first upper interconnections 65 may be disposed on the plurality of first upper plugs 61. For example, lower surfaces of the plurality of first upper interconnections 65 may contact upper surfaces of the plurality of first upper plugs 61. The plurality of second upper plugs 71 may be disposed on the plurality of first upper interconnections 65. For example, lower surfaces of the plurality of second upper plugs 71 may contact upper surfaces of the plurality of first upper interconnections 65. The second group 55 may be disposed on the first group 53 of the upper insulating layer 50. For example, a lower surface of the second group 55 may contact an upper surface of the first group 53. The plurality of second upper interconnections 75 may be disposed in the second group 55. The plurality of second upper interconnections 75 may be in contact with the plurality of second upper plugs 71. The opening 55W may pass through the second group 55 of the upper insulating layer 50. At least some of the plurality of second upper interconnections 75 may be exposed at a bottom of the opening 55W.

Each of the plurality of first upper plugs 61, the plurality of first upper interconnections 65, the plurality of second upper plugs 71, and the plurality of second upper interconnections 75 may include a metal, a metal nitride, a metal oxide, a metal silicide, a conductive carbon, or a combination thereof. Each of the plurality of first upper plugs 61, the plurality of first upper interconnections 65, the plurality of second upper plugs 71, and the plurality of second upper interconnections 75 may include W, Al, Ni, Sn, Ti, TiN, Ta, TaN, WN, Cu, or a combination thereof.

In an example embodiment, each of the plurality of first upper interconnections 65 and the plurality of second upper interconnections 75 may include a material different from the plurality of middle interconnections 45 and the plurality of middle plugs 47. Each of the plurality of first upper interconnections 65 and the plurality of second upper interconnections 75 may include a material different from the plurality of first upper plugs 61 and the plurality of second upper plugs 71. For example, each of the plurality of first upper interconnections 65 and the plurality of second upper interconnections 75 may include an Al layer, and each of the plurality of first upper plugs 61 and the plurality of second upper plugs 71 may include a W layer.

Each of the lower insulating layer 30, the contact spacers 38, the interlayer insulating layer 40, the upper insulating layer 50, and the substrate insulating layer 91 may include silicon oxide, silicon nitride, silicon oxynitride, a low-k dielectric, a high-k dielectric, or a combination thereof. Each of the lower insulating layer 30, the contact spacers 38, the interlayer insulating layer 40, the upper insulating layer 50, and the substrate insulating layer 91 may include a single layer or a multilayered structure.

Referring to FIGS. 1 and 2, the plurality of middle interconnections 45 may include a first middle interconnection 45A, a plurality of second middle interconnections 45B, a plurality of third middle interconnections 45C, and a plurality of fourth middle interconnections 45D. The plurality of middle plugs 47 may include a plurality of first middle plugs 47A, a plurality of second middle plugs 47B, and a plurality of third middle plugs 47C.

The upper insulating layer 50 may include a first upper insulating layer 53A, a second upper insulating layer 53B, a third upper insulating layer 53C, a fourth upper insulating layer 53D, a fifth upper insulating layer 53E, a sixth upper insulating layer 55A, and a seventh upper insulating layer 55B. The first group 53 may include the first upper insulating layer 53A, the second upper insulating layer 53B, the third upper insulating layer 53C, the fourth upper insulating layer 53D, and the fifth upper insulating layer 53E. The second group 55 may include the sixth upper insulating layer 55A and the seventh upper insulating layer 55B.

Each of the plurality of first upper plugs 61 may include a first barrier layer 61A and a first conductive layer 61B. Each of the plurality of first upper interconnections 65 may include a second barrier layer 65A, a second conductive layer 65B, and a third barrier layer 65C. Each of the plurality of second upper plugs 71 may include a fourth barrier layer 71A and a third conductive layer 71B. Each of the plurality of second upper interconnections 75 may include a fifth barrier layer 75A, a fourth conductive layer 75B, and a sixth barrier layer 75C.

The plurality of second middle interconnections 45B may be disposed on the first middle interconnection 45A. The first middle interconnection 45A may be in direct contact with the through electrode 39. The plurality of first middle plugs 47A may be disposed between the plurality of second middle interconnections 45B and the first middle interconnection 45A. The plurality of first middle plugs 47A may be in contact with the plurality of second middle interconnections 45B and the first middle interconnection 45A. The plurality of third middle interconnections 45C may be disposed on the plurality of second middle interconnections 45B. The plurality of second middle plugs 47B may be disposed between the plurality of third middle interconnections 45C and the plurality of second middle interconnections 45B. The plurality of second middle plugs 47B may be in contact with the plurality of third middle interconnections 45C and the plurality of second middle interconnections 45B. The plurality of fourth middle interconnections 45D may be disposed on the plurality of third middle interconnections 45C. The plurality of third middle plugs 47C may be disposed between the plurality of fourth middle interconnections 45D and the plurality of third middle interconnections 45C. The plurality of third middle plugs 47C may be in contact with the plurality of fourth middle interconnections 45D and the plurality of third middle interconnections 45C.

In an example embodiment, the first middle interconnection 45A may correspond to a lowermost layer of the plurality of middle interconnections 45. The plurality of fourth middle interconnections 45D may correspond to an uppermost layer of the plurality of middle interconnections 45. Each of the plurality of fourth middle interconnections 45D may have a first thickness Ti. The first middle interconnection 45A, each of the plurality of second middle interconnections 45B, and each of the plurality of third middle interconnections 45C may have a thickness substantially the same as that of each of the plurality of fourth middle interconnections 45D. As used herein, the terms "thickness" and "height" may refer to the thickness or height measured in a direction perpendicular to a top surface of the substrate 21. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

In an example embodiment, the plurality of first middle plugs 47A may correspond to a lowermost layer of the plurality of middle plugs 47. The plurality of third middle plugs 47C may correspond to an uppermost layer of the plurality of middle plugs 47. Each of the plurality of third middle plugs 47C may have a first height H1. The first height H1 may be substantially equal to a gap between the plurality of third middle interconnections 45C and the plurality of fourth middle interconnections 45D. Each of the plurality of first middle plugs 47A and the plurality of second middle plugs 47B may have a height substantially the same as that of each of the plurality of third middle plugs 47C.

The fourth upper insulating layer 53D and the fifth upper insulating layer 53E may be sequentially stacked on the interlayer insulating layer 40. In an example embodiment, the fourth upper insulating layer 53D may correspond to an etch stop layer. The fourth upper insulating layer 53D may include a material having an etch selectivity with respect to the fifth upper insulating layer 53E. The fifth upper insulating layer 53E may include silicon oxide or a low-k dielectric, and the fourth upper insulating layer 53D may include silicon nitride, silicon oxynitride, silicon boron nitride (SiBN), or silicon carbonitride (SiCN).

Each of the plurality of first upper plugs 61 may extend into the fifth upper insulating layer 53E and the fourth upper insulating layer 53D. For example, upper surfaces of the plurality of first upper plugs 61 may be coplanar with an upper surface of the fifth upper insulating layer 53E, and lower surfaces of the plurality of first upper plugs 61 may be coplanar with a lower surface of the fourth upper insulating layer 53D. The plurality of first upper interconnections 65 may be disposed on the fifth upper insulating layer 53E. For example, lower surfaces of the plurality of first upper interconnections 65 may contact the upper surface of the fifth upper insulating layer 53E. Each of the plurality of first upper plugs 61 may pass through the fifth upper insulating layer 53E and the fourth upper insulating layer 53D and be in contact with a corresponding one of the plurality of fourth middle interconnections 45D and a corresponding one of the plurality of first upper interconnections 65.

In an example embodiment, the first barrier layer 61A may surround a side surface and a bottom of the first conductive layer 61B. The first conductive layer 61B may include a W layer. The first barrier layer 61A may include a WN layer. The second conductive layer 65B may be disposed on the second barrier layer 65A. For example, a lower surface of the second conductive layer 65B may contact an upper surface of the second barrier layer 65A. The third barrier layer 65C may be disposed on the second conductive layer 65B. For example, a lower surface of the third barrier layer 65C may contact an upper surface of the second conductive layer 65B. The second conductive layer 65B may be disposed between the second barrier layer 65A and the third barrier layer 65C. The second conductive layer 65B may include a material different from the plurality of middle interconnections 45, the plurality of middle plugs 47, and the first conductive layer 61B. The second conductive layer 65B may include an Al layer. Each of the second barrier layer 65A and the third barrier layer 65C may include Ti, TiN, Ta, TaN, WN, or a combination thereof. One or all of the second barrier layer 65A and the third barrier layer 65C may be omitted.

In an example embodiment, each of the plurality of first upper interconnections 65 may have a second thickness T2. The second thickness T2 may be greater than the first thickness T1. Each of the plurality of first upper plugs 61 may have a second height H2. The second height H2 may be greater than the first height H1. The second height H2 may be substantially equal to a gap between the plurality of fourth middle interconnections 45D and the plurality of first upper interconnections 65.

The first upper insulating layer 53A may be disposed on the fifth upper insulating layer 53E. For example, a lower surface of the first upper insulating layer 53A may contact an upper surface of the fifth upper insulating layer 53E. The first upper insulating layer 53A may cover upper surfaces and side surfaces of the plurality of first upper interconnections 65. The second upper insulating layer 53B may be disposed on the first upper insulating layer 53A. For example, a lower surface of the second upper insulating layer 53B may contact an upper surface of the first upper insulating layer 53A. The second upper insulating layer 53B may correspond to a capping layer. The second upper insulating layer 53B may control outgassing of lower layers during an annealing process. The third upper insulating layer 53C may be disposed on the second upper insulating layer 53B. For example, a lower surface of the third upper insulating layer 53C may contact an upper surface of the second upper insulating layer 53B.

In an example embodiment, the first upper insulating layer 53A may include an oxide layer such as high-density plasma (HDP) oxide. The second upper insulating layer 53B may include a material different from the first upper insulating layer 53A. The second upper insulating layer 53B may include a nitride layer such as silicon nitride. The third upper insulating layer 53C may include a material different from the second upper insulating layer 53B. The third upper insulating layer 53C may include an oxide layer formed using tetraethyl orthosilicate (TEOS) or fluorinated tetraethyl orthosilicate (FTEOS).

Each of the plurality of second upper plugs 71 may extend into the third upper insulating layer 53C, the second upper insulating layer 53B, and the first upper insulating layer 53A. Each of the plurality of second upper interconnections 75 may be disposed on the third upper insulating layer 53C. For example, lower surfaces of the plurality of second upper interconnections 75 may contact an upper surface of the third upper insulating layer 53C. Each of the plurality of second upper plugs 71 may pass through the third upper insulating layer 53C, the second upper insulating layer 53B, and the first upper insulating layer 53A and be in contact with a corresponding one of the plurality of first upper interconnections 65 and a corresponding one of the plurality of second upper interconnections 75.

In an example embodiment, the fourth barrier layer 71A may surround a side surface and a bottom of the third conductive layer 71B. The third conductive layer 71B may include a W layer. The fourth barrier layer 71A may include a WN layer. The fourth conductive layer 75B may be disposed on the fifth barrier layer 75A. For example, a lower surface of the fourth conductive layer 75B may contact an upper surface of the fifth barrier layer 75A. The sixth barrier layer 75C may be disposed on the fourth conductive layer 75B. For example, a lower surface of the sixth barrier layer 75C may contact an upper surface of the fourth conductive layer 75B. The fourth conductive layer 75B may be disposed between the fifth barrier layer 75A and the sixth barrier layer 75C. The fourth conductive layer 75B may include a material different from the plurality of middle interconnections 45, the plurality of middle plugs 47, and the third conductive layer 71B. The fourth conductive layer 75B may include an Al layer. Each of the fifth barrier layer 75A and the sixth barrier layer 75C may include Ti, TiN, Ta, TaN, WN, or a combination thereof. One or all of the fifth barrier layer 75A and the sixth barrier layer 75C may be omitted. For example, the fifth barrier layer 75A may be omitted. In such embodiments, the lower surface of the fourth conductive layer 75B may contact the upper surface of the third upper insulating layer 53C.

In an example embodiment, each of the plurality of second upper interconnections 75 may have a third thickness T3. The third thickness T3 may be greater than the first thickness T1. The third thickness T3 may be in the range of 2 to 100 times the first thickness T1. The third thickness T3 may be greater than or equal to the second thickness T2. The third thickness T3 may be in the range of about 2 μm to about 10 μm. For example, the third thickness T3 may be about 2.5 μm.

In an example embodiment, each of the plurality of second upper plugs 71 may have a third height H3. The third height H3 may be substantially equal to a gap between the plurality of first upper interconnections 65 and the plurality of second upper interconnections 75. The third height H3 may be greater than the first height H1. The third height H3 may be greater than or equal to the second height H2. The third height H3 may range from about 0.5 μm to about 5 μm. For example, the third height H3 may be about 1.7 μm.

The sixth upper insulating layer 55A may be disposed on the third upper insulating layer 53C. For example, a lower surface of the sixth upper insulating layer 55A may contact an upper surface of the third upper insulating layer 53C. The sixth upper insulating layer 55A may cover side surfaces and upper surfaces of the plurality of second upper interconnections 75. The seventh upper insulating layer 55B may be disposed on the sixth upper insulating layer 55A. The opening 55W may pass through the seventh upper insulating layer 55B and the sixth upper insulating layer 55A. Portions of the plurality of second upper interconnections 75 may be exposed at a bottom of the opening 55W. The seventh upper insulating layer 55B may include a material different from the sixth upper insulating layer 55A. For example, the seventh upper insulating layer 55B may include a nitride such as silicon nitride, and the sixth upper insulating layer 55A may include an oxide such as silicon oxide.

In an exemplary embodiment, the sixth upper insulating layer 55A may include an oxide layer such as HDP oxide. The seventh upper insulating layer 55B may include an oxide layer formed using TEOS or FTEOS. In an exemplary embodiment, the sixth upper insulating layer 55A may include an oxide layer formed using TEOS or FTEOS. The seventh upper insulating layer 55B may include an oxide layer such as HDP oxide.

An interconnection resistance may be reduced due to configurations of the plurality of first upper plugs 61, the plurality of first upper interconnections 65, the plurality of second upper plugs 71, and the plurality of second upper interconnections 75. Configurations of the first upper insulating layer 53A, the second upper insulating layer 53B, and the third upper insulating layer 53C may improve interlayer insulation characteristics. The second upper insulating layer 53B may improve the electrical characteristics and reliability of a plurality of active/passive elements, which are disposed in the lower insulating layer 30 and/or the interlayer insulating layer 40.

Referring to FIGS. 1 and 3, the second upper interconnection 75 may include the fourth conductive layer 75B and the sixth barrier layer 75C. The fourth conductive layer 75B may be in contact with the plurality of second upper plugs 71. For example, the lower surface of the fourth conductive layer 75B may contact upper surfaces of the plurality of second upper plugs 71.

Referring to FIGS. 1 and 4, in an example embodiment, the memory cell MC may include a DRAM cell. The memory cell MC may include the substrate 21, a first lower insulating layer 30A, a second lower insulating layer 30B, a device isolation layer 23, a gate dielectric layer 24, a plurality of gate electrodes 25, a gate capping layer 26, a plurality of source/drain regions 27, a bit plug 28, a bit line 29, a plurality of buried contact plugs 32, a plurality of landing pads 33, a plurality of first electrodes 35, a capacitor dielectric layer 36, and a second electrode 37. The lower insulating layer 30 may include the first lower insulating layer 30A and the second lower insulating layer 30B.

The device isolation layer 23 may be formed in the substrate 21 using a shallow trench isolation (STI) technique. An upper surface of the device isolation layer 23 may be coplanar with the upper surface of the substrate 21. Each of the plurality of gate electrodes 25 may be disposed at a lower level than an upper end of the substrate 21. For example, upper surfaces of the plurality of gate electrodes 25 may be at a lower level than the upper surface of the substrate 21. The gate dielectric layer 24 may surround side surfaces and bottoms of the plurality of gate electrodes 25. The gate dielectric layer 24 may be interposed between the plurality of gate electrodes 25 and the substrate 21. The gate capping layer 26 may be disposed on the plurality of gate electrodes 25. The plurality of source/drain regions 27 may be disposed in the substrate 21 adjacent to the plurality of gate electrodes 25.

The gate dielectric layer 24, the plurality of gate electrodes 25, and the plurality of source/drain regions 27 may constitute a plurality of cell transistors. Each of the plurality of cell transistors may correspond to a recess channel transistor. In an example embodiment, each of the plurality of cell transistors may include a fin field effect transistor (finFET), a multi-bridge channel (MBC) transistor, a nanowire transistor, a vertical transistor, a recess channel transistor, a three-dimensional (3D) transistor, a planar transistor, or a combination thereof.

The first lower insulating layer 30A may cover the device isolation layer 23, the gate capping layer 26, and the plurality of source/drain regions 27. The bit plug 28 and the bit line 29 may be disposed in the first lower insulating layer 30A. The bit line 29 may be disposed on the bit plug 28. The bit plug 28 may pass through the first lower insulating layer 30A and be in contact with a corresponding one of the plurality of source/drain regions 27. The plurality of buried contact plugs 32 and the plurality of landing pads 33 may be disposed in the first lower insulating layer 30A. Each of the plurality of landing pads 33 may be in contact with an upper surface of a corresponding one of the plurality of buried contact plugs 32. Upper surfaces of the plurality of landing pads 33 may be coplanar with an upper surface of the first lower insulating layer 30A. Each of the plurality of buried contact plugs 32 may be in contact with a corresponding one of the plurality of source/drain regions 27.

The plurality of first electrodes 35 may be disposed on the plurality of landing pads 33. For example, lower surfaces of the plurality of first electrodes 35 may contact upper surfaces of the plurality of landing pads 33. The capacitor dielectric layer 36 may be disposed on the plurality of first electrodes 35. The second electrode 37 may be disposed on the capacitor dielectric layer 36. The plurality of first electrodes 35, the capacitor dielectric layer 36, and the second electrode 37 may constitute a plurality of cell capacitors. Each of the plurality of first electrodes 35 may correspond to a lower electrode of the cell capacitor. Each of the plurality of first electrodes 35 may be referred to as a storage electrode. The second electrode 37 may correspond to an upper electrode of the cell capacitor. The second electrode 37 may be referred to as a plate electrode. The second lower insulating layer 30B may cover the second electrode 37.

Each of the plurality of cell capacitors may include various kinds of 3D capacitors. For example, each of the plurality of first electrodes 35 may include a pillar structure, a cylindrical structure (e.g., a one-cylinder storage (OCS) structure), or a combination thereof.

Each of the gate dielectric layer 24 and the capacitor dielectric layer 36 may include silicon oxide, silicon nitride, silicon oxynitride, a high-k dielectric, or a combination thereof. Each of the plurality of gate electrodes 25, the bit plug 28, the bit line 29, the plurality of buried contact plugs 32, the plurality of landing pads 33, the plurality of first electrodes 35, and the second electrode 37 may include a metal, a metal nitride, a metal oxide, a metal silicide, a conductive carbon, polysilicon, or a combination thereof. Each of the device isolation layer 23, the gate capping layer 26, the first lower insulating layer 30A, and the second lower insulating layer 30B may include silicon oxide, silicon nitride, silicon oxynitride, a low-k dielectric, a high-k dielectric, or a combination thereof.

Figure 9:
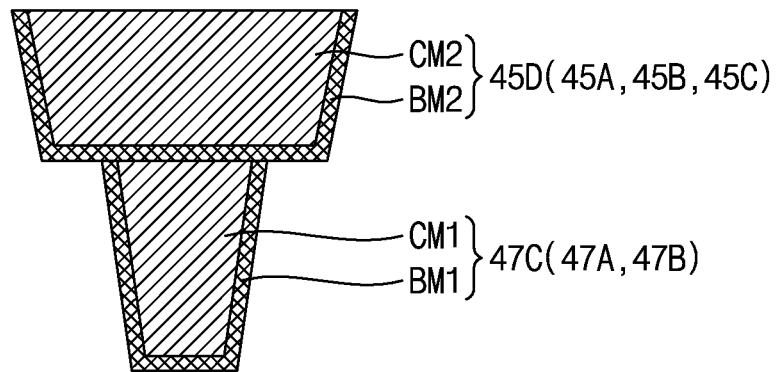
FIGS. 9 and 10 are enlarged views illustrating a portion of FIG. 5.
Figure 10:
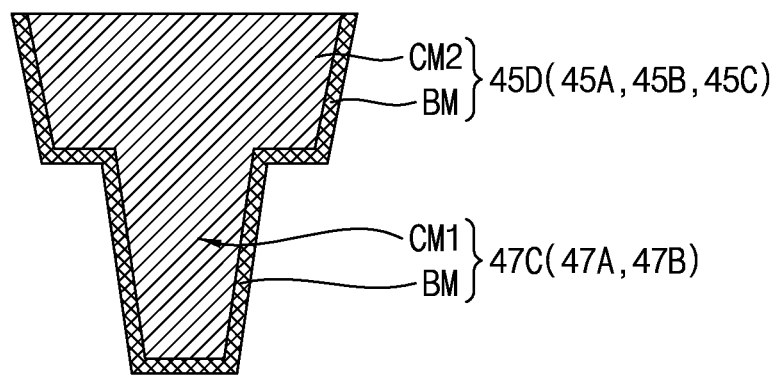

FIGS. 5 to 8 are cross-sectional views for describing semiconductor devices according to embodiments of the inventive concept. FIGS. 9 and 10 are enlarged views illustrating a portion of FIG. 5.

Figure 5:
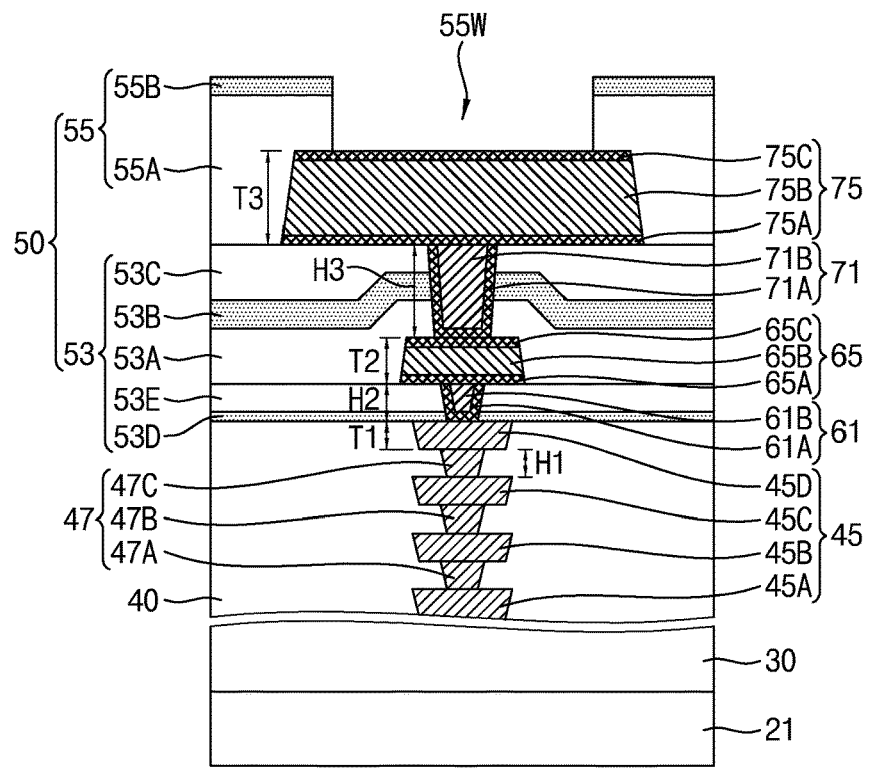
FIGS. 5 to 8 are cross-sectional views illustrating semiconductor devices according to example embodiments of the inventive concept.

Referring to FIG. 5, a semiconductor device according to an example embodiment of the inventive concept may include a substrate 21, a lower insulating layer 30, an interlayer insulating layer 40, a plurality of middle interconnections 45, a plurality of middle plugs 47, an upper insulating layer 50, a first upper plug 61, a first upper interconnection 65, a second upper plug 71, a second upper interconnection 75, and an opening 55W.

In an example embodiment, each of the plurality of middle interconnections 45 and the plurality of middle plugs 47 may be formed using a damascene process. Each of the plurality of middle interconnections 45 and the plurality of middle plugs 47 may exhibit an inverted trapezoidal shape having an upper lateral width greater than a lower lateral width thereof. Each of the first upper interconnections 65 and the second upper interconnections 75 may be formed using a patterning process. Each of the first upper interconnections 65 and the second upper interconnections 75 may exhibit a trapezoidal shape having an upper lateral width smaller than a lower lateral width thereof. Each of the first upper plug 61 and the second upper plug 71 may exhibit an inverted trapezoidal shape having an upper lateral width greater than a lower lateral width thereof.

Figure 6:
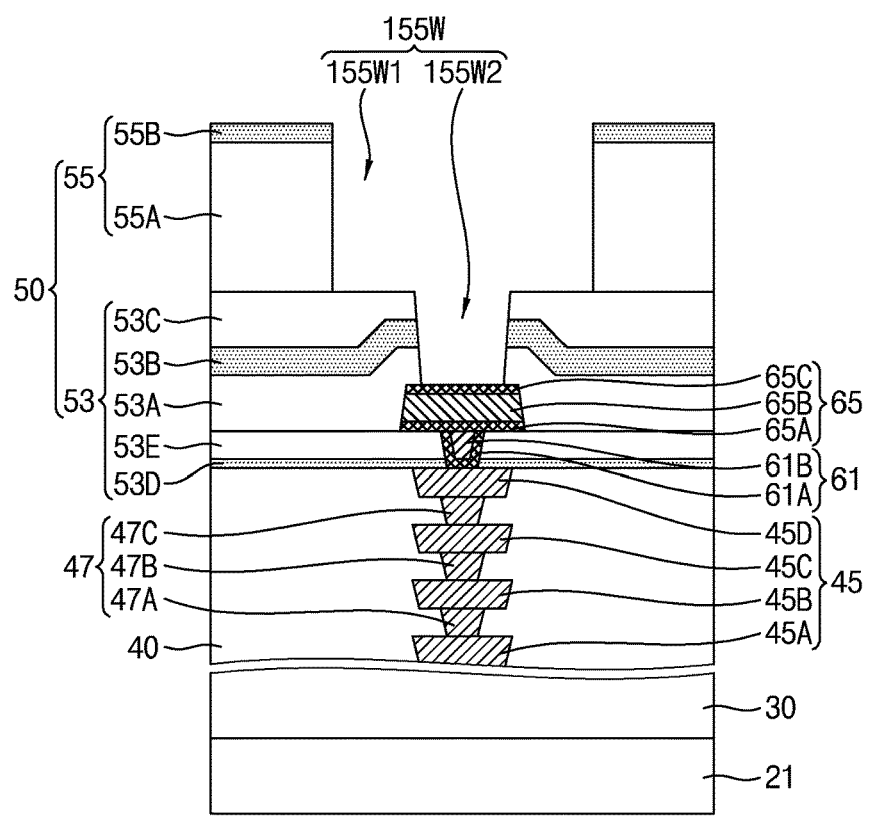

Referring to FIG. 6, a test opening 155W may include a first opening 155W1 and a second opening 155W2. The second opening 155W2 may be communicate with a bottom of the first opening 155W1. A first upper interconnection 65 may be exposed at a bottom of the second opening 155W2. The first opening 155W1 may pass through a seventh upper insulating layer 55B and a sixth upper insulating layer 55A. The second opening 155W2 may pass through a third upper insulating layer 53C, a second upper insulating layer 53B, and a first upper insulating layer 53A.

Figure 7:
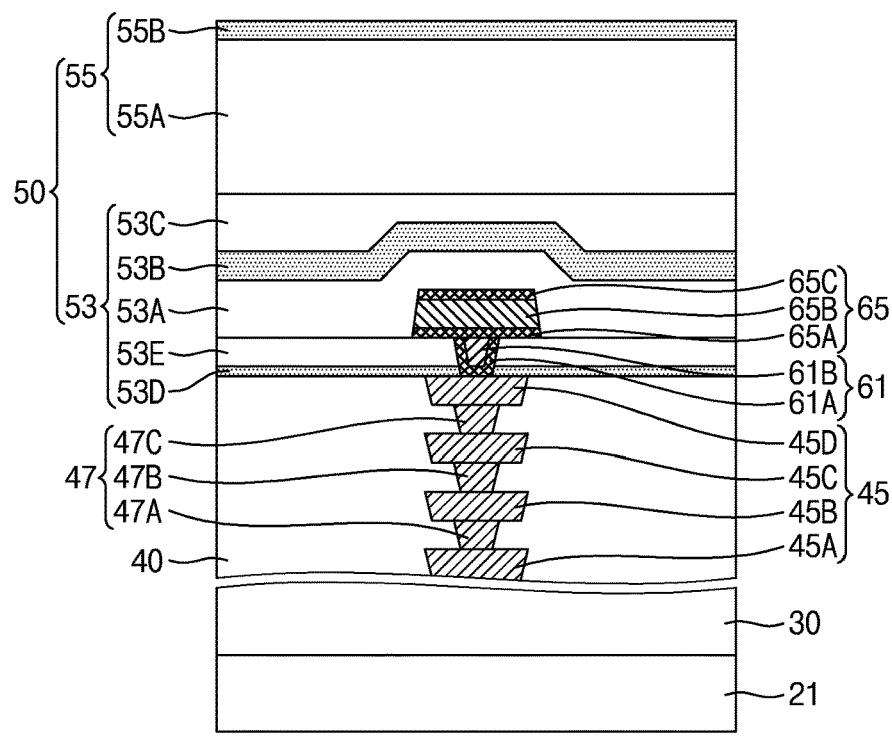

Referring to FIG. 7, a first upper insulating layer 53A, a second upper insulating layer 53B, a third upper insulating layer 53C, a sixth upper insulating layer 55A, and a seventh upper insulating layer 55B may be sequentially stacked on a first upper interconnection 65. The first upper insulating layer 53A, the second upper insulating layer 53B, the third upper insulating layer 53C, the sixth upper insulating layer 55A, and the seventh upper insulating layer 55B may completely cover the first upper interconnection 65.

Figure 8:
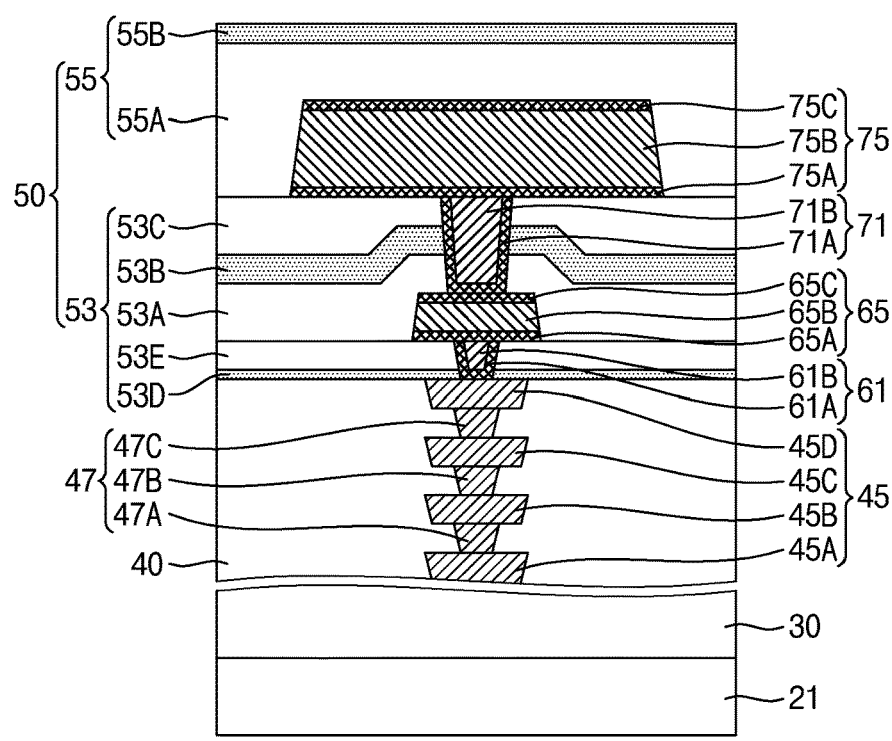

Referring to FIG. 8, a sixth upper insulating layer 55A and a seventh upper insulating layer 55B may be sequentially stacked on a second upper interconnection 75. The sixth upper insulating layer 55A and the seventh upper insulating layer 55B may completely cover the second upper interconnection 75.

Referring to FIG. 9, a third middle plug 47C may include a seventh barrier layer BM1 and a fifth conductive layer CM1. The seventh barrier layer BM1 may surround a side surface and a bottom of the fifth conductive layer CM1. A fourth middle interconnection 45D may include an eighth barrier layer BM2 and a sixth conductive layer CM2. The eighth barrier layer BM2 may surround a side surface and a bottom of the sixth conductive layer CM2. The eighth barrier layer BM2 may be interposed between the fifth conductive layer CM1 and the sixth conductive layer CM2. For example, an upper surface of the eighth barrier layer BM2 may contact a lower surface of the sixth conductive layer CM2, and a lower surface of the eighth barrier layer BM2 may contact an upper surface of the fifth conductive layer CM1. Each of the fifth conductive layer CM1 and the sixth conductive layer CM2 may include a Cu layer. Each of the seventh barrier layer BM1 and the eighth barrier layer BM2 may include Ti, TiN, Ta, TaN, or a combination thereof. Each of the first and second middle plugs 47A and 47B may exhibit a configuration similar to that of the third middle plug 47C. For example, each of the first and second middle plugs 47A and 47B may include a conductive layer and a barrier layer surrounding side and bottom surfaces of the conductive layer. Each of the first to third middle interconnections 45A, 45B, and 45C may exhibit a configuration similar to that of the fourth middle interconnection 45D. For example, each of the first to third middle interconnections 45A, 45B, and 45C may include a conductive layer and a barrier layer surrounding side and bottom surfaces of the conductive layer.

Referring to FIG. 10, a third middle plug 47C may include a ninth barrier layer BM and a fifth conductive layer CM1. A fourth middle interconnection 45D may include the ninth barrier layer BM and a sixth conductive layer CM2. The fifth conductive layer CM1 may be integrally formed with the sixth conductive layer CM2. The sixth conductive layer CM2 may be materially continuous with the fifth conductive layer CM1. Each of the fifth conductive layer CM1 and the sixth conductive layer CM2 may include a Cu layer. The ninth barrier layer BM may surround a bottom and side surfaces of the fifth and sixth conductive layers CM1 and CM2. The ninth barrier layer BM may include Ti, TiN, Ta, TaN, or a combination thereof. Each of the first and second middle plugs 47A and 47B may exhibit a configuration similar to that of the third middle plug 47C. For example, each of the first and second middle plugs 47A and 47B may include a conductive layer and a barrier layer surrounding bottom and side surfaces of the conductive layer. Each of the first to third middle interconnections 45A, 45B, and 45C may exhibit a configuration similar to that of the fourth middle interconnection 45D. For example, each of the second and third middle interconnections 45B and 45C may include a conductive layer that is materially continuous with the conductive layer of the first and second middle plugs 47A and 47B, respectively, and a barrier layer that surrounds bottom and side surfaces of the conductive layer. The first middle interconnection 45A may include a conductive layer and a barrier layer surrounding bottom and side surfaces of the conductive layer.

Figure 11:
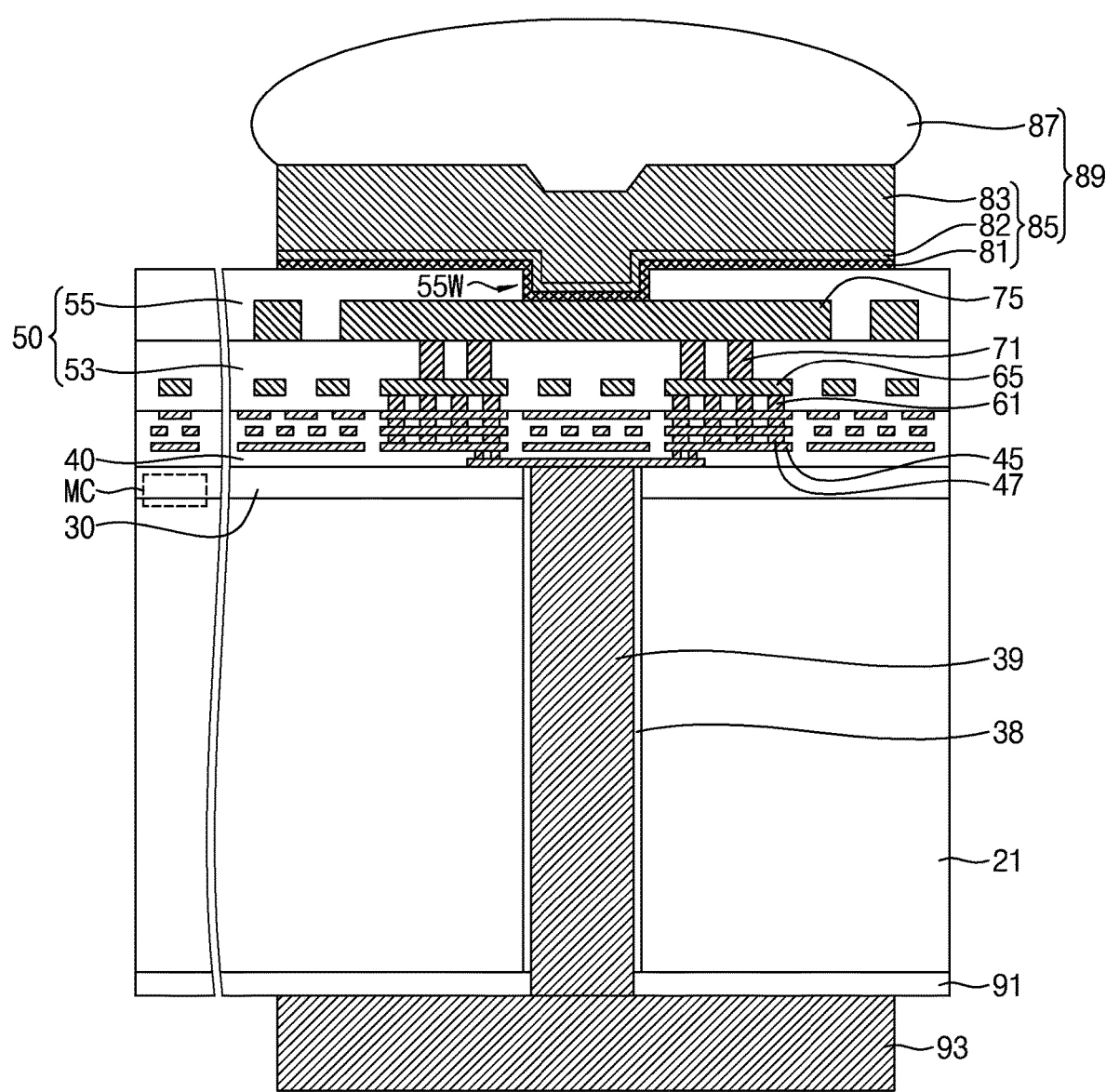
FIGS. 11 to 13 are cross-sectional views illustrating semiconductor devices according to example embodiments of the inventive concept.
Figure 12:
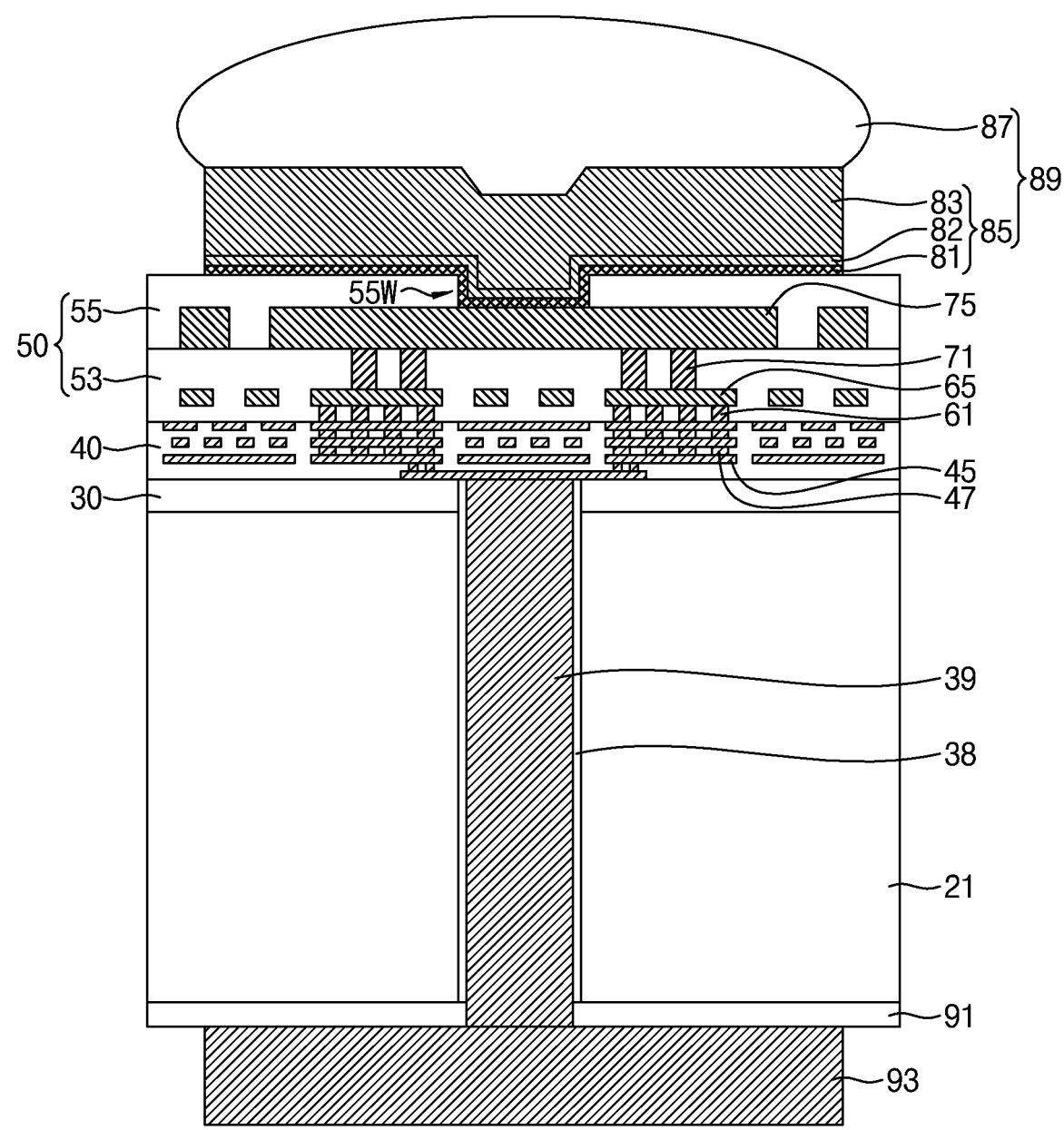
Figure 13:
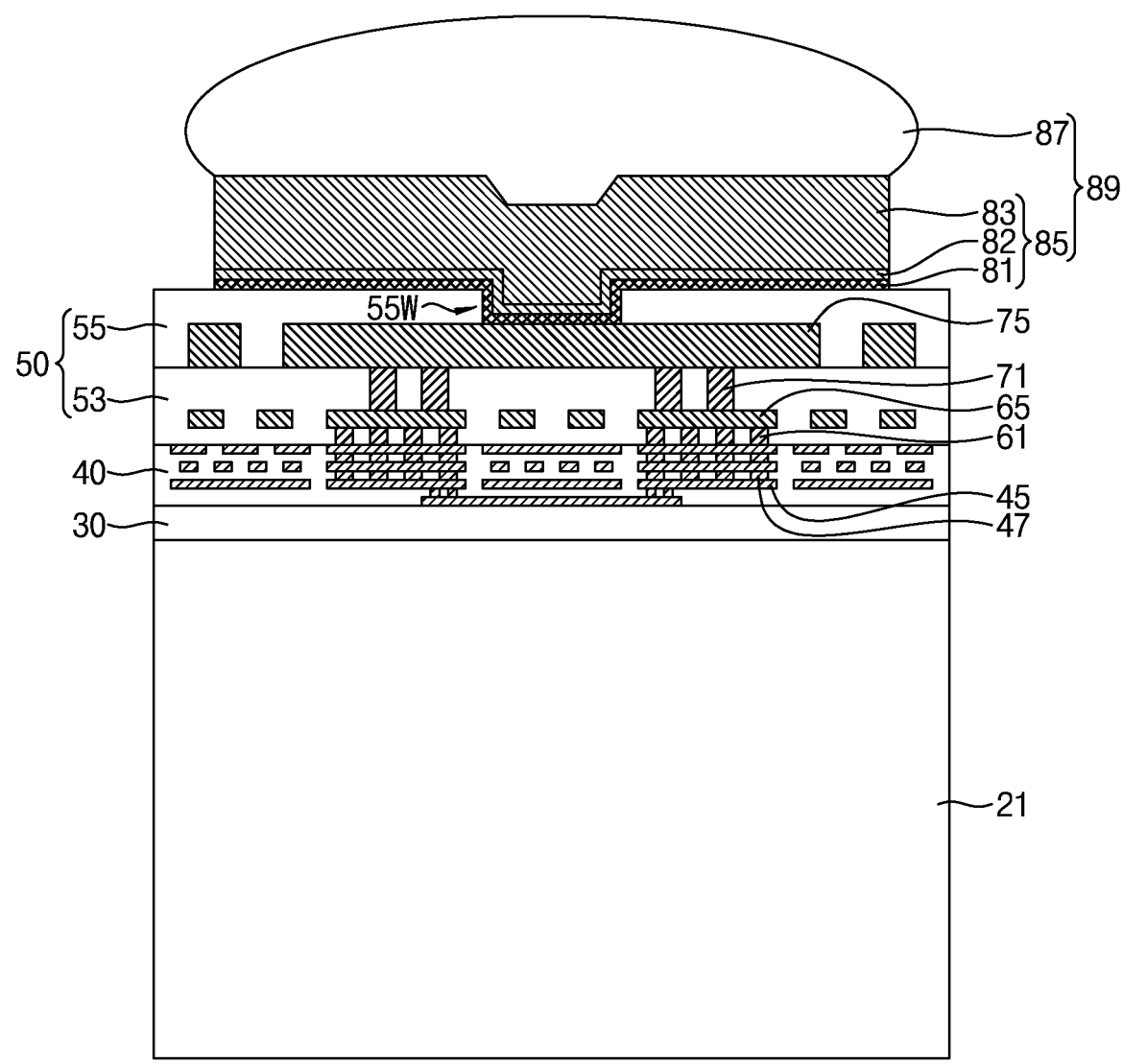

FIGS. 11 to 13 are cross-sectional views for describing semiconductor devices according to example embodiments of the inventive concept.

Referring to FIG. 11, a semiconductor device according to an example embodiment of the inventive concept may include a substrate 21, a lower insulating layer 30, a memory cell MC, contact spacers 38, a through electrode 39, an interlayer insulating layer 40, a plurality of middle interconnections 45, a plurality of middle plugs 47, an upper insulating layer 50, a plurality of first upper plugs 61, a plurality of first upper interconnections 65, a plurality of second upper plugs 71, a plurality of second upper interconnections 75, an opening 55W, a first bump 89, a substrate insulating layer 91, and a protruding electrode 93. The first bump 89 may include a pillar structure 85 and a solder 87. The pillar structure 85 may include a barrier layer 81, a seed layer 82, and a pillar 83.

The first bump 89 may have a diameter of about 1 µm to about 50 µm. The first bump 89 may have a height of about 1 µm to about 70 µm. In an embodiment, the first bump 89 may have a diameter of about 10 µm to about 50 µm. In an embodiment, the first bump 89 may have a diameter of about 1 µm to about 40 µm. In an embodiment, the first bump 89 may have a height of about 10 µm to about 70 µm. In an embodiment, the first bump 89 may have a height of about 1 µm to about 60 µm.

The pillar structure 85 may be disposed on the upper insulating layer 50. For example, a bottom surface of the pillar structure 85 may contact an upper surface of the upper insulating layer 50. The pillar structure 85 may extend into a second group 55 of the upper insulating layer 50. For example, the pillar structure 85 may extend below the upper surface of the second group 55. The pillar structure 85 may pass through the second group 55 and be in contact with an upper surface of a corresponding one of the plurality of second upper interconnections 75. The barrier layer 81 may include Ti, TiN, Ta, TaN, or a combination thereof. The seed layer 82 may be disposed on the barrier layer 81. The seed layer 82 may include Cu. The pillar 83 may be disposed on the seed layer 82. For example, a lower surface of the pillar 83 may contact an upper surface of the seed layer 82, and a lower surface of the seed layer 82 may contact an upper surface of the barrier layer 81.

The pillar 83 may include nickel (Ni), copper (Cu), aluminum (Al), silver (Ag), platinum (Pt), ruthenium (Ru), tin (Sn), gold (Au), tungsten (W), tungsten nitride (WN), titanium (Ti), titanium nitride (TiN), tantalum (Ta), tantalum nitride (TaN), or a combination thereof. For example, the pillar 83 may include a Ni layer.

The solder 87 may be disposed on the pillar structure 85. The solder 87 may include Sn, Ag, Cu, Ni, Au, or a combination thereof. For example, the solder 87 may include a Sn—Ag—Cu layer. An interfacial metal layer may be further formed between the pillar structure 85 and the solder 87, but a description thereof will be omitted for brevity.

Referring to FIG. 12, a semiconductor device according to an example embodiment of the inventive concept may include a substrate 21, a lower insulating layer 30, contact spacers 38, a through electrode 39, an interlayer insulating layer 40, a plurality of middle interconnections 45, a plurality of middle plugs 47, an upper insulating layer 50, a plurality of first upper plugs 61, a plurality of first upper interconnections 65, a plurality of second upper plugs 71, a plurality of second upper interconnections 75, an opening 55W, a first bump 89, a substrate insulating layer 91, and a protruding electrode 93.

Referring to FIG. 13, a semiconductor device according to an example embodiment of the inventive concept may include a substrate 21, a lower insulating layer 30, an interlayer insulating layer 40, a plurality of middle interconnections 45, a plurality of middle plugs 47, an upper insulating layer 50, a plurality of first upper plugs 61, a plurality of first upper interconnections 65, a plurality of second upper plugs 71, a plurality of second upper interconnections 75, an opening 55W, and a first bump 89.

Figure 14:
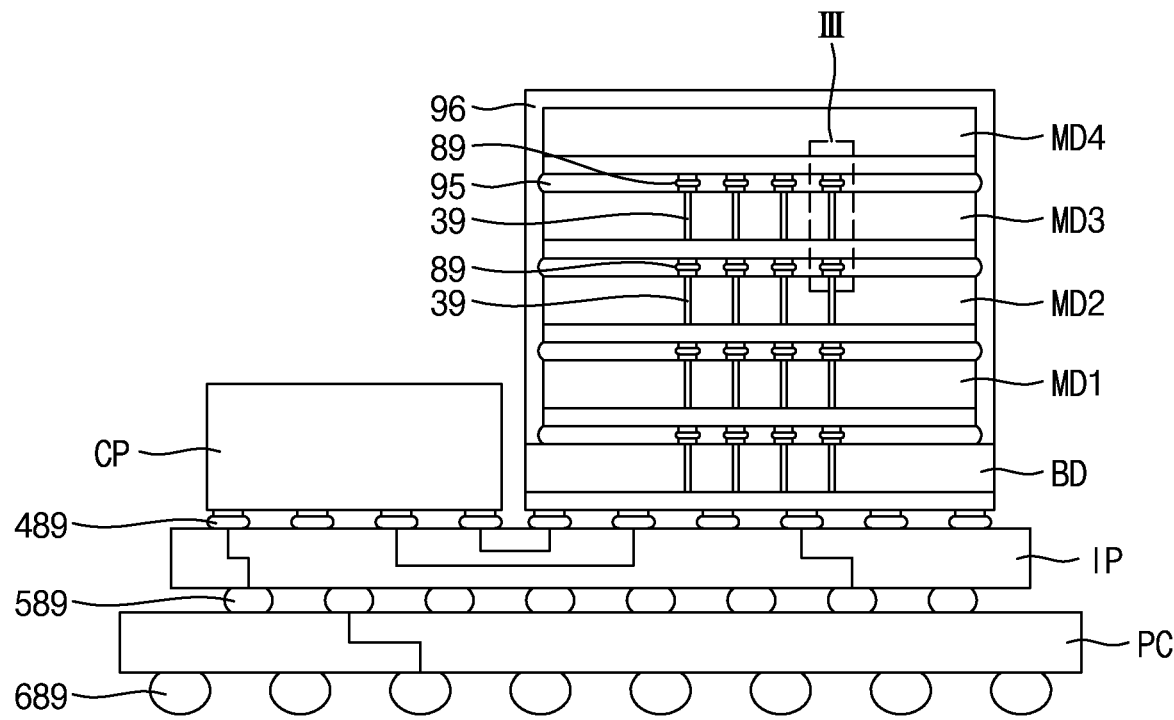
FIGS. 14 and 15 are cross-sectional views illustrating semiconductor devices according to example embodiments of the inventive concept.
Figure 15:
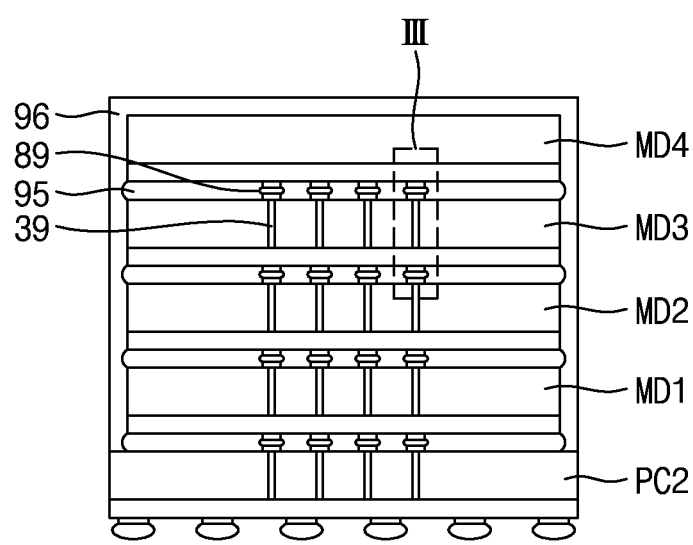
Figure 16:
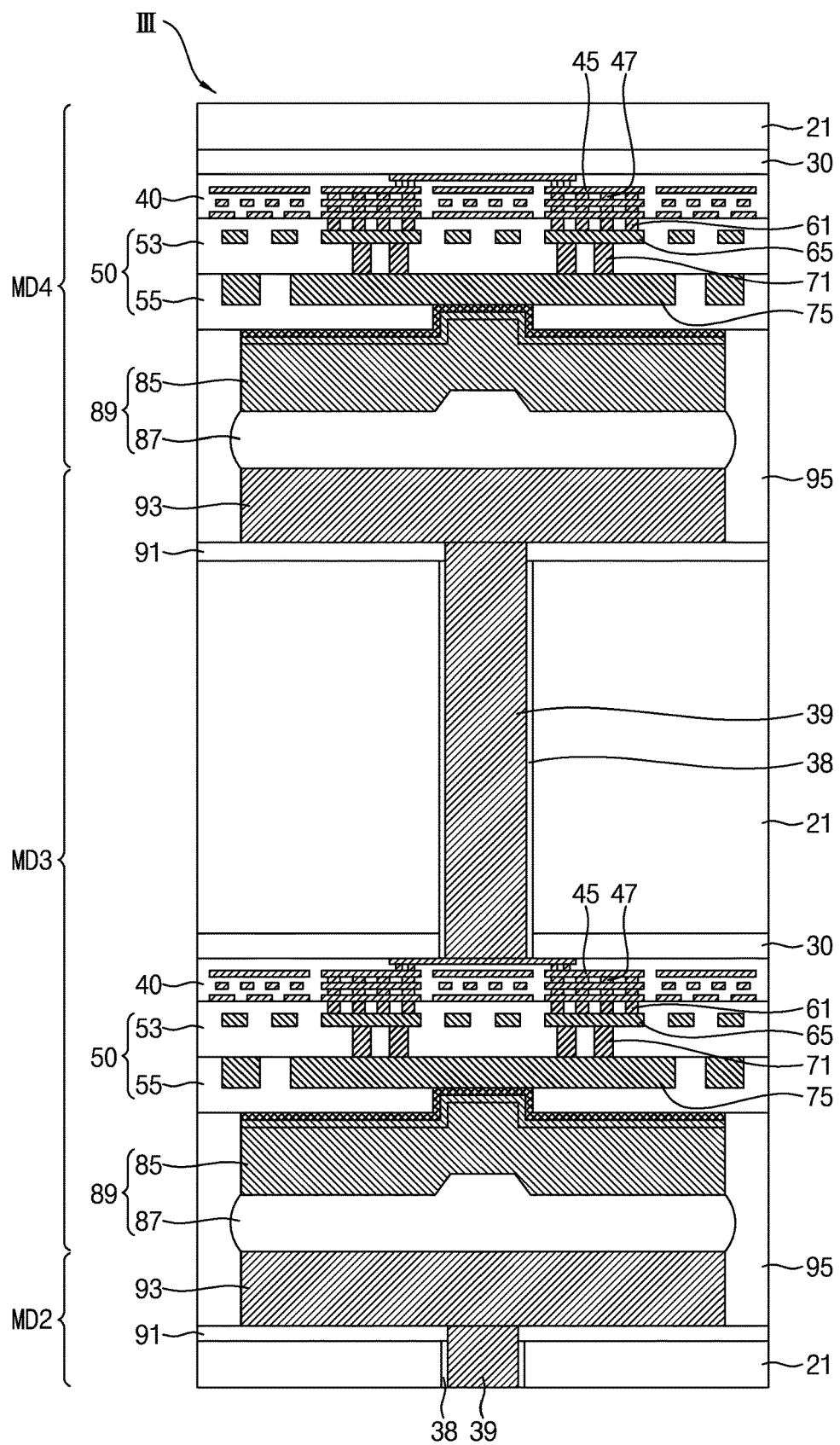
FIG. 16 is an enlarged view illustrating portions of FIGS. 14 and 15.

FIGS. 14 and 15 are cross-sectional views for describing semiconductor devices according to example embodiments of the inventive concept. FIG. 16 is an enlarged view illustrating portions III of FIGS. 14 and 15. A semiconductor device according to the embodiment of the inventive concept may include a hybrid memory cube (HMC), a high bandwidth memory (HBM), a double-data-rate fifth-generation (DDR5) DRAM, or a combination thereof.

Referring to FIG. 14, a semiconductor device according to an example embodiment of the inventive concept may include a printed circuit board (PCB) PC, a relay substrate IP, a plurality of semiconductor chips CP, BD, and MD1 to MD4, a plurality of bumps 89, 489, 589, and 689, an adhesive layer 95, and an encapsulant 96. The plurality of semiconductor chips CP, BD, and MD1 to MD4 may include a microprocessor CP, a buffer chip BD, and a plurality of memory chips MD1 to MD4. In an example embodiment, the plurality of memory chips MD1 to MD4 may be sequentially and vertically stacked on the buffer chip BD. The plurality of memory chips MD1 to MD4 may include memory chips corresponding to various combinations of numbers such as three, four, seven, eight, eleven, twelve, fifteen, sixteen, nineteen, or more.

The plurality of memory chips MD1 to MD4 may include a first memory chip MD1, a second memory chip MD2, a third memory chip MD3, and a fourth memory chip MD4. At least some of the plurality of memory chips MD1 to MD4 may include a plurality of through electrodes 39. The plurality of bumps 89, 489, 589, and 689 may include a plurality of first bumps 89, a plurality of second bumps 489, a plurality of third bumps 589, and a plurality of fourth bumps 689.

The PCB PC may include a rigid PCB, a flexible PCB, or a rigid-flexible PCB. The PCB PC may include a multilayered circuit board. The PCB PC may correspond to a package substrate or a main board. The plurality of fourth bumps 689 may be disposed on a lower surface of the PCB PC. The relay substrate IP may be disposed on the PCB PC. The plurality of third bumps 589 may be disposed between the PCB PC and the relay substrate IP.

The plurality of semiconductor chips CP, BD, and MD1 to MD4 may be disposed on the relay substrate IP. The relay substrate IP may include a semiconductor substrate such as a silicon interposer. In an example embodiment, the microprocessor CP and the buffer chip BD may be disposed on the relay substrate IP. The plurality of second bumps 489 may be disposed between the microprocessor CP and the relay substrate IP and between the buffer chip BD and the relay substrate IP. The microprocessor CP may include various kinds of processors, such as a graphics processing unit (GPU) or an application processor (AP). The buffer chip BD may include various elements such as a memory controller. The buffer chip BD may be connected to the microprocessor CP via the relay substrate IP and the plurality of second bumps 489.

The plurality of memory chips MD1 to MD4 may be sequentially stacked on the buffer chip BD. Each of the plurality of memory chips MD1 to MD4 may include a plurality of components similar to those described with reference to FIGS. 1 to 13. For example, each of the plurality of memory chips MD1 to MD4 may correspond to the semiconductor devices illustrate with reference to FIGS. 1 to 13. In some embodiments, each of the plurality of memory chips MD1 to MD4 may include the plurality of first bumps 89. In an example embodiment, the adhesive layer 95 may be disposed between the plurality of memory chips MD1 to MD4 and between the first memory chips MD1 and the buffer chip BD. The adhesive layer 95 may include a non-conductive film (NCF).

The plurality of first bumps 89 may be disposed between the plurality of memory chips MD1 to MD4 and between the first memory chip MD1 and the buffer chip BD. The plurality of first bumps 89 may extend into the adhesive layer 95. The plurality of first bumps 89 may pass through the adhesive layer 95. The plurality of memory chips MD1 to MD4 may be connected to the buffer chip BD via the plurality of first bumps 89 and the plurality of through electrodes 39. The encapsulant 96 may be disposed on the buffer chip BD to cover the plurality of memory chips MD1 to MD4. The encapsulant 96 may include an epoxy molding compound (EMC).

In an exemplary embodiment, the buffer chip BD may denote a master chip. Each of the plurality of memory chips MD1 to MD4 may denote a slave chip. In an exemplary embodiment, the first memory chip MD1 may denote a master chip. Each of the second memory chip MD2, the third memory chip MD3, and the fourth memory chip MD4 may denote a slave chip.

Referring to FIG. 15, a semiconductor device according to an example embodiment of the inventive concept may include a plurality of memory chips MD1 to MD4, which are sequentially stacked on a package substrate PC2.

The package substrate PC2 may include a PCB such as a rigid PCB, a flexible PCB, or a rigid-flexible PCB. The plurality of memory chips MD1 to MD4 may include a first memory chip MD1, a second memory chip MD2, a third memory chip MD3, and a fourth memory chip MD4. An adhesive layer 95 may be disposed between the plurality of memory chips MD1 to MD4 and between the first memory chip MD1 and the package substrate PC2. The adhesive layer 95 may include an NCF.

The plurality of memory chips MD1 to MD4 may be connected to the package substrate PC2 via a plurality of first bumps 89 and a plurality of through electrodes 39. An encapsulant 96 may be disposed on the package substrate PC2 to cover the plurality of memory chips MD1 to MD4. The encapsulant 96 may include an EMC. A plurality of second bumps 489 may be disposed on a lower surface of the package substrate PC2. In an exemplary embodiment, the first memory chip MD1 may denote a master chip. Each of the second memory chip MD2, the third memory chip MD3, and the fourth memory chip MD4 may denote a slave chip.

Referring to FIG. 16, the third memory chip MD3 may include a substrate 21, a lower insulating layer 30, contact spacers 38, a through electrode 39, an interlayer insulating layer 40, a plurality of middle interconnections 45, a plurality of middle plugs 47, an upper insulating layer 50, a plurality of first upper plugs 61, a plurality of first upper interconnections 65, a plurality of second upper plugs 71, a plurality of second upper interconnections 75, a first bump 89, a substrate insulating layer 91, and a protruding electrode 93.

The second memory chip MD2 may include a configuration similar to that of the third memory chip MD3. A solder 87 of the third memory chip MD3 may be adhered to a protruding electrode 93 of the second memory chip MD2. A solder 87 of the fourth memory chip MD4 may be adhered to the protruding electrode 93 of the third memory chip MD3.

FIGS. 17 to 21 are cross-sectional views for describing methods of forming semiconductor devices according to embodiments of the inventive concept.

Figure 17:
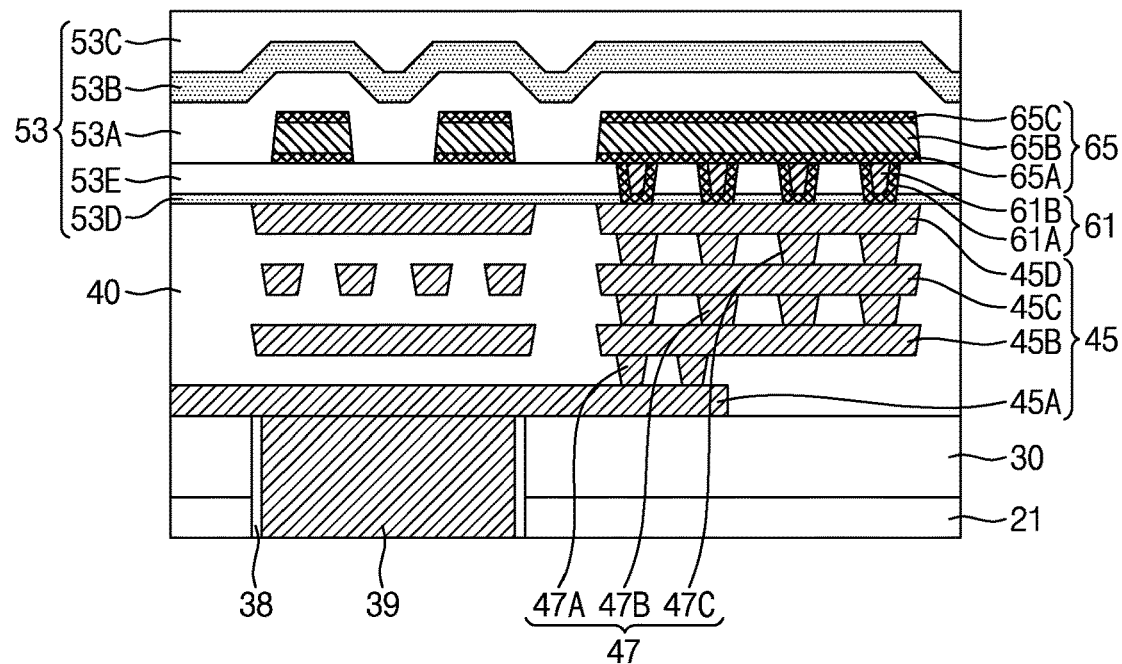
FIGS. 17 to 21 are cross-sectional views for illustrating methods of forming semiconductor devices according to example embodiments of the inventive concept.

Referring to FIG. 17, a lower insulating layer 30 may be formed on a substrate 21. Contact spacers 38 and a through electrode 39 may be formed to pass through the lower insulating layer 30 and the substrate 21. An interlayer insulating layer 40, a plurality of middle interconnections 45, and a plurality of middle plugs 47 may be formed on the lower insulating layer 30.

The plurality of middle interconnections 45 may include a first middle interconnection 45A, a plurality of second middle interconnections 45B, a plurality of third middle interconnections 45C, and a plurality of fourth middle interconnections 45D. The plurality of middle plugs 47 may include a plurality of first middle plugs 47A, a plurality of second middle plugs 47B, and a plurality of third middle plugs 47C. The plurality of middle interconnections 45 and the plurality of middle plugs 47 may be formed in the interlayer insulating layer 40. The first middle interconnection 45A may be in contact with the through electrode 39. The formation of the plurality of middle interconnections 45 and the plurality of middle plugs 47 may include a plurality of damascene processes.

A first group 53, a plurality of first upper plugs 61, and a plurality of first upper interconnections 65 may be formed on the interlayer insulating layer 40. The first group 53 may include a first upper insulating layer 53A, a second upper insulating layer 53B, a third upper insulating layer 53C, a fourth upper insulating layer 53D, and a fifth upper insulating layer 53E.

The fourth upper insulating layer 53D and the fifth upper insulating layer 53E may be sequentially stacked on the interlayer insulating layer 40. Each of the plurality of first upper plugs 61 may pass through the fifth upper insulating layer 53E and the fourth upper insulating layer 53D and may be in contact with a corresponding one of the plurality of fourth middle interconnections 45D. Each of the plurality of first upper plugs 61 may include a first conductive layer 61B and a first barrier layer 61A configured to surround a side surface and a bottom of the first conductive layer 61B.

The plurality of first upper interconnections 65 may be formed on the fifth upper insulating layer 53E. The formation of the plurality of first upper interconnections 65 may include a patterning process. At least one of the plurality of first upper interconnections 65 may be in contact with the plurality of first upper plugs 61. Each of the plurality of first upper interconnections 65 may include a second barrier layer 65A, a second conductive layer 65B disposed on the second barrier layer 65A, and a third barrier layer 65C disposed on the second conductive layer 65B.

The first upper insulating layer 53A may be formed on the fifth upper insulating layer 53E. The first upper insulating layer 53A may cover upper surfaces and side surfaces of the plurality of first upper interconnections 65. The second upper insulating layer 53B may be formed on the first upper insulating layer 53A. The second upper insulating layer 53B may correspond to a capping layer. The second upper insulating layer 53B may control outgassing of lower layers during an annealing process. The third upper insulating layer 53C may be formed on the second upper insulating layer 53B. An upper surface of the third upper insulating layer 53C may be planarized.

In an example embodiment, the first upper insulating layer 53A may include an oxide layer such as HDP oxide. The second upper insulating layer 53B may include a material different from the first upper insulating layer 53A. The second upper insulating layer 53B may include a nitride layer such as silicon nitride. The third upper insulating layer 53C may include an oxide layer formed using TEOS or FTEOS.

Figure 18:
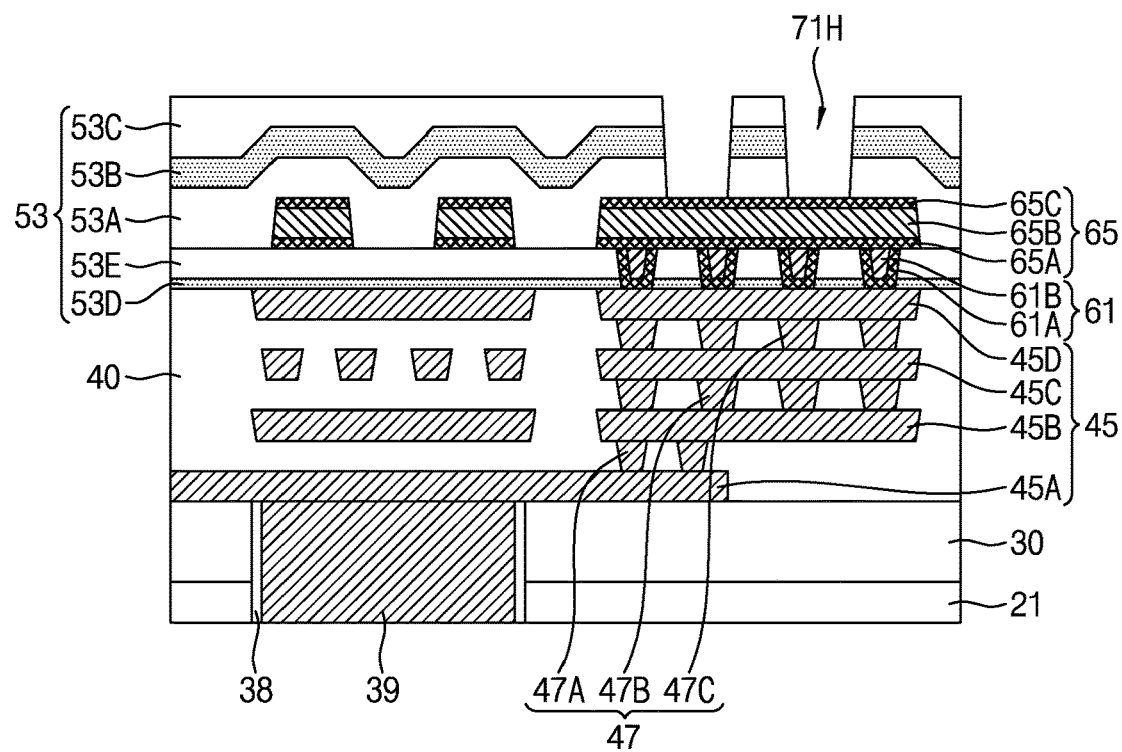

Referring to FIG. 18, a plurality of contact holes 71H may be formed using a patterning process to pass through the third upper insulating layer 53C, the second upper insulating layer 53B, and the first upper insulating layer 53A. The upper surfaces of the plurality of first upper interconnections 65 may be exposed at bottoms of the plurality of contact holes 71H.

Figure 19:
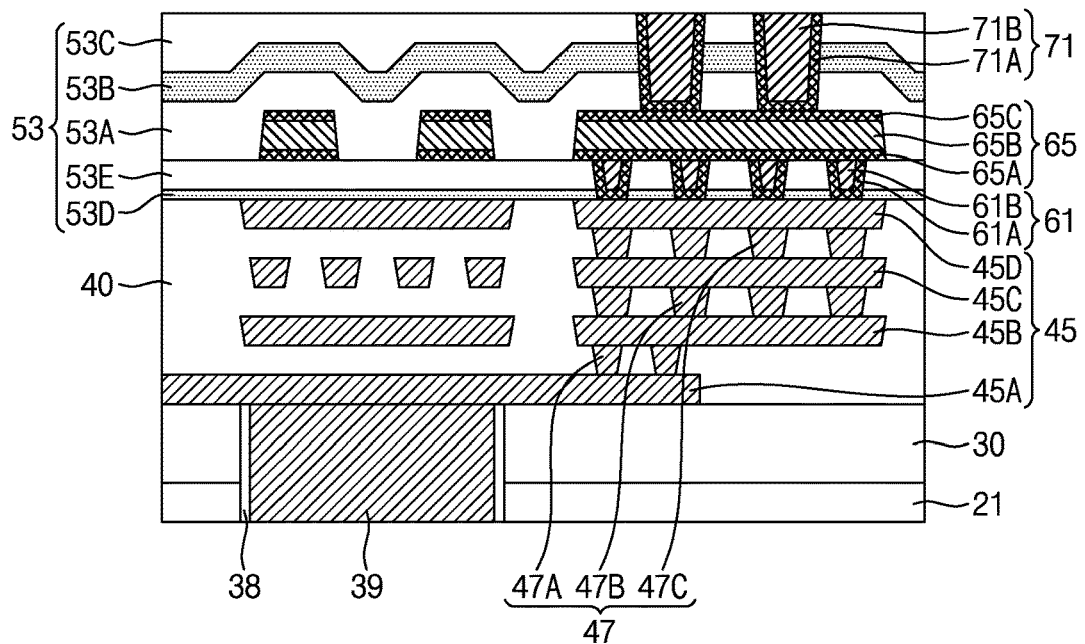

Referring to FIG. 19, a plurality of second upper plugs 71 may be formed inside the plurality of contact holes 71H. Each of the plurality of second upper plugs 71 may include a third conductive layer 71B and a fourth barrier layer 71A surrounding a side surface and a bottom of the third conductive layer 71B.

Figure 20:
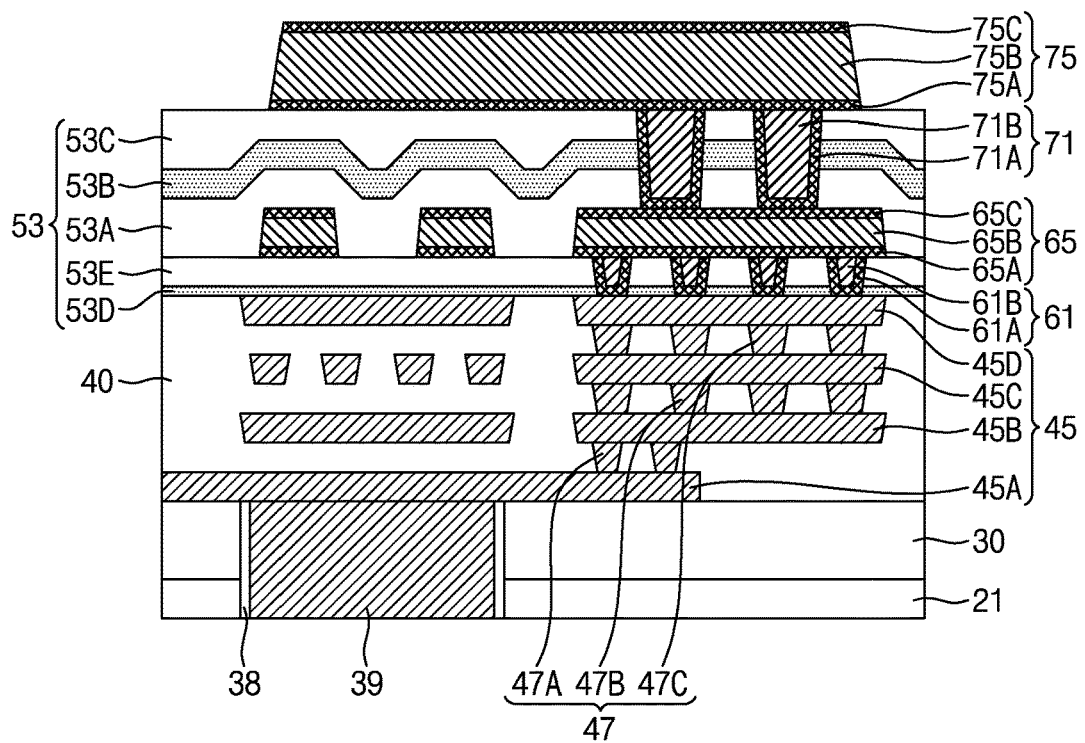

Referring to FIG. 20, a second upper interconnection 75 may be formed on the third upper insulating layer 53C and in contact with the plurality of second upper plugs 71. The formation of the second upper interconnection 75 may include a patterning process. The second upper interconnection 75 may include a fifth barrier layer 75A, a fourth conductive layer 75B disposed on the fifth barrier layer 75A, and a sixth barrier layer 75C disposed on the fourth conductive layer 75B.

Figure 21:
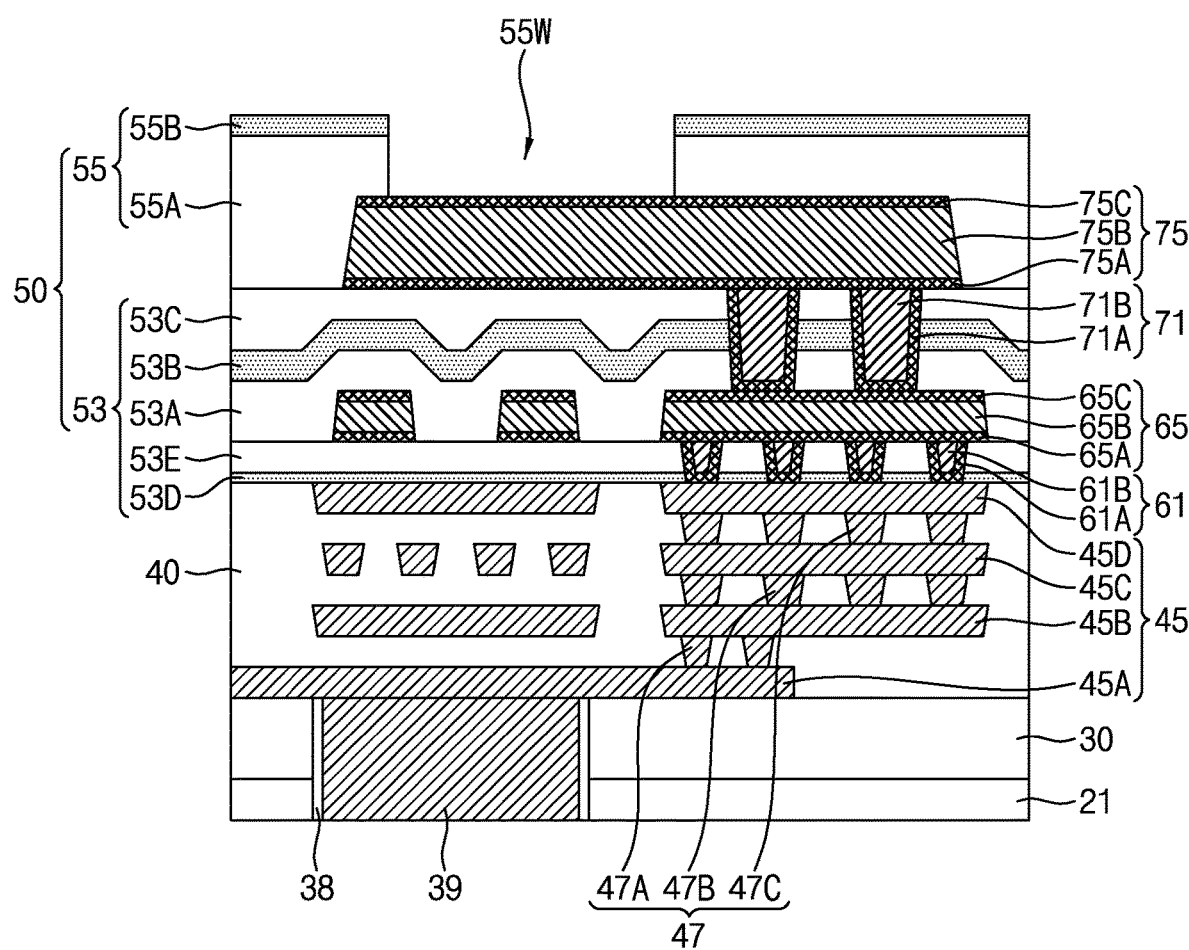

Referring to FIG. 21, a sixth upper insulating layer 55A may be formed on the third upper insulating layer 53C. The sixth upper insulating layer 55A may cover a side surface and an upper surface of the second upper interconnection 75. A seventh upper insulating layer 55B may be formed on the sixth upper insulating layer 55A. An opening 55W may be formed to pass through the seventh upper insulating layer 55B and the sixth upper insulating layer 55A. A portion of the second upper interconnection 75 may be exposed at a bottom of the opening 55W.

According to the example embodiments of the inventive concept, an interconnection resistance can be markedly reduced due to configurations of a plurality of middle interconnections, a plurality of first upper plugs, a plurality of first upper interconnections, a plurality of second upper plugs, and a plurality of second upper interconnections. Configurations of a first upper insulating layer, a second upper insulating layer, and a third upper insulating layer can improve interlayer insulation characteristics. The second upper insulating layer can improve the electrical characteristics and reliability of a plurality of active/passive elements, which are disposed in the lower insulating layer and/or the interlayer insulating layer. A semiconductor device can be implemented that simplifies a process and has excellent current driving capability and a high signal transmission rate.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A semiconductor device comprising:
an interlayer insulating layer disposed on a substrate;
a plurality of middle interconnections disposed in the interlayer insulating layer;
a plurality of middle plugs disposed in the interlayer insulating layer and between the plurality of middle interconnections;
an upper insulating layer disposed on the interlayer insulating layer;
a first upper plug disposed in the upper insulating layer and connected to one middle interconnection of the plurality of middle interconnections, the one middle interconnection having a first thickness;
a first upper interconnection disposed in the upper insulating layer on the first upper plug and having a second thickness, wherein the second thickness is greater than the first thickness;
a second upper plug disposed in the upper insulating layer on the first upper interconnection;
a second upper interconnection disposed in the upper insulating layer on the second upper plug and having a third thickness, wherein the third thickness is greater than the first thickness; and
an opening configured to pass through the upper insulating layer to expose the second upper interconnection,
wherein the upper insulating layer comprises:
a first upper insulating layer,
a second upper insulating layer disposed on the first upper insulating layer and comprising a material different from that of the first upper insulating layer, and
a third upper insulating layer disposed on the second upper insulating layer and comprising a material different from that of the second upper insulating layer,
wherein the first upper insulating layer, the second upper insulating layer, and the third upper insulating layer are disposed between the first upper interconnection and the second upper interconnection,
wherein the second upper plug passes through the first upper insulating layer, the second upper insulating layer, and the third upper insulating layer and contacts the first upper interconnection and the second upper interconnection,
wherein the third thickness is in the range of 2 to 100 times the first thickness, and
wherein the second upper interconnection comprises a material different from that of the second upper plug.

2. The semiconductor device of claim 1, wherein the third thickness is greater than or equal to the second thickness.

3. The semiconductor device of claim 1, wherein the third thickness is in the range of 2 μm to 10 μm.

4. The semiconductor device of claim 1,
wherein each of the plurality of middle plugs has a first height,
wherein the first upper plug has a second height greater than the first height, and
wherein the second upper plug has a third height greater than the first height.

5. The semiconductor device of claim 4, wherein the third height is greater than or equal to the second height.

6. The semiconductor device of claim 1, wherein each of the first upper interconnection and the second upper interconnection comprises a material layer different from that of the plurality of middle interconnections.

7. The semiconductor device of claim 6,
wherein the plurality of middle interconnections comprise a copper (Cu) layer, and
wherein the second upper interconnection comprises an aluminum (Al) layer.

8. The semiconductor device of claim 6, wherein the first upper interconnection comprises an Al layer.

9. The semiconductor device of claim 6, wherein the second upper plug comprises a tungsten (W) layer.

10. The semiconductor device of claim 1,
wherein the first upper insulating layer comprises an oxide layer,
wherein the second upper insulating layer comprises a nitride layer, and
wherein the third upper insulating layer comprises an oxide layer.

11. The semiconductor device of claim 1, further comprising a through electrode extending into the substrate and connected to the plurality of middle interconnections.

12. The semiconductor device of claim 11, wherein the through electrode has a diameter of 1 μm to 20 μm.

13. The semiconductor device of claim 1, further comprising:
a lower insulating layer disposed between the substrate and the interlayer insulating layer; and
a memory cell disposed in the lower insulating layer.

14. The semiconductor device of claim 13, wherein the memory cell comprises a dynamic random access memory (DRAM) cell, a static RAM (SRAM) cell, a flash memory cell, a magneto-resistive RAM (MRAM) cell, a phase-change RAM (PRAM) cell, a ferroelectric RAM (FeRAM) cell, a resistive RAM (RRAM) cell, or a combination thereof.

15. A semiconductor device comprising:
a plurality of semiconductor chips sequentially stacked on a printed circuit board (PCB),
wherein at least one of the plurality of semiconductor chips comprises:
a lower insulating layer disposed on a substrate;
a memory cell disposed in the lower insulating layer;
an interlayer insulating layer disposed on the lower insulating layer;
a plurality of middle interconnections disposed in the interlayer insulating layer;
a plurality of middle plugs disposed in the interlayer insulating layer and between the plurality of middle interconnections;
an upper insulating layer disposed on the interlayer insulating layer;
a first upper plug disposed in the upper insulating layer and connected to one middle interconnection of the plurality of middle interconnections, the one middle interconnection having a first thickness;
a first upper interconnection disposed in the upper insulating layer on the first upper plug and having a second thickness, wherein the second thickness is greater than the first thickness;
a second upper plug disposed in the upper insulating layer and on the first upper interconnection;
a second upper interconnection disposed in the upper insulating layer on the second upper plug and having a third thickness, wherein the third thickness is greater than the first thickness;
a bump disposed on the upper insulating layer, the bump extending into the upper insulating layer and contacting the second upper interconnection; and
a through electrode extending into the substrate and connected to the plurality of middle interconnections,
wherein the upper insulating layer comprises:
a first upper insulating layer,
a second upper insulating layer disposed on the first upper insulating layer and comprising a material different from that of the first upper insulating layer, and
a third upper insulating layer disposed on the second upper insulating layer and comprising a material different from that of the second upper insulating layer,
wherein the first upper insulating layer, the second upper insulating layer, and the third upper insulating layer are disposed between the first upper interconnection and the second upper interconnection,
wherein the second upper plug passes through the first upper insulating layer, the second upper insulating layer, and the third upper insulating layer and contacts the first upper interconnection and the second upper interconnection,
wherein the third thickness is in the range of 2 to 100 times the first thickness, and
wherein the second upper interconnection comprises a material different from that of the second upper plug.

16. The semiconductor device of claim 15, wherein the bump has a diameter of 10 μm to 50 μm.

17. The semiconductor device of claim 15, wherein the third thickness is greater than or equal to the second thickness.

18. The semiconductor device of claim 15,
wherein each of the plurality of middle plugs has a first height,
wherein the first upper plug has a second height greater than the first height, and
wherein the second upper plug has a third height greater than the first height.

19. A semiconductor device comprising:
a relay substrate;
a microprocessor disposed on the relay substrate;
a buffer chip disposed on the relay substrate; and
a plurality of semiconductor chips sequentially stacked on the buffer chip,
wherein at least one of the plurality of semiconductor chips comprises:
a lower insulating layer disposed on a substrate;
a memory cell disposed in the lower insulating layer;
an interlayer insulating layer disposed on the lower insulating layer;
a plurality of middle interconnections disposed in the interlayer insulating layer;
a plurality of middle plugs disposed in the interlayer insulating layer and between the plurality of middle interconnections;
an upper insulating layer disposed on the interlayer insulating layer;
a first upper plug disposed in the upper insulating layer and connected to one middle interconnection of the plurality of middle interconnections, the one middle interconnection having a first thickness;
a first upper interconnection disposed in the upper insulating layer on the first upper plug and having a second thickness, wherein the second thickness is greater than the first thickness;
a second upper plug disposed in the upper insulating layer and on the first upper interconnection;
a second upper interconnection disposed in the upper insulating layer on the second upper plug and having a third thickness, wherein the third thickness is greater than the first thickness;
a bump disposed on the upper insulating layer, the bump extending into the upper insulating layer and contacting the second upper interconnection; and
a through electrode extending into the substrate and connected to the plurality of middle interconnections,
wherein the upper insulating layer comprises:
a first upper insulating layer;
a second upper insulating layer disposed on the first upper insulating layer and comprising a material different from that of the first upper insulating layer; and
a third upper insulating layer disposed on the second upper insulating layer and comprising a material different from that of the second upper insulating layer, wherein the first upper insulating layer, the second upper insulating layer, and the third upper insulating layer are disposed between the first upper interconnection and the second upper interconnection, wherein the second upper plug passes through the first upper insulating layer, the second upper insulating layer, and the third upper insulating layer and contacts the first upper interconnection and the second upper interconnection, wherein the third thickness is in the range of 2 to 100 times the first thickness, and wherein the second upper interconnection comprises a material different from the second upper plug.

\* \* \* \* \*